(12) United States Patent
Choi

(10) Patent No.: US 9,171,610 B2
(45) Date of Patent: Oct. 27, 2015

(54) STATIC RANDOM ACCESS MEMORY DEVICE INCLUDING DUAL POWER LINE AND BIT LINE PRECHARGE METHOD THEREOF

(71) Applicant: Jong-Sang Choi, Seoul (KR)

(72) Inventor: Jong-Sang Choi, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/293,454

(22) Filed: Jun. 2, 2014

(65) Prior Publication Data

US 2015/0063007 A1 Mar. 5, 2015

(30) Foreign Application Priority Data

Aug. 30, 2013 (KR) .......................... 10-2013-0104369

(51) Int. Cl.
| | | |
|---|---|---|
| G11C 11/413 | (2006.01) | |
| G11C 5/14 | (2006.01) | |
| G11C 7/12 | (2006.01) | |
| G11C 11/419 | (2006.01) | |
| G11C 11/4074 | (2006.01) | |

(52) U.S. Cl.
CPC ................ *G11C 11/419* (2013.01); *G11C 7/12* (2013.01); *G11C 5/147* (2013.01); *G11C 11/4074* (2013.01)

(58) Field of Classification Search
CPC ........ G11C 7/12; G11C 5/147; G11C 11/4074
USPC ............. 365/154, 155, 156, 189.09, 203, 205
See application file for complete search history.

(56) References Cited

U.S. PATENT DOCUMENTS

| | | | |
|---|---|---|---|
| 6,831,871 | B2 | 12/2004 | Khellah et al. |
| 7,679,948 | B2 | 3/2010 | Park et al. |
| 7,936,624 | B2 | 5/2011 | Clinton |
| 7,952,939 | B2 | 5/2011 | Chen et al. |
| 8,098,533 | B2 | 1/2012 | Nii et al. |
| 8,218,390 | B2 | 7/2012 | Nii et al. |
| 8,331,180 | B2 | 12/2012 | Adams et al. |
| 8,488,396 | B2 | 7/2013 | Lee et al. |
| 2012/0063211 | A1 | 3/2012 | Sharma et al. |

FOREIGN PATENT DOCUMENTS

| | | |
|---|---|---|
| JP | 2006221769 | 8/2006 |
| JP | 2009048670 | 3/2009 |

*Primary Examiner* — Ly D Pham
(74) *Attorney, Agent, or Firm* — F. Chau & Associates, LLC

(57) ABSTRACT

A static random access memory (SRAM) device is provided. A memory cell is supplied with a first driving voltage. A bit line pair is connected to the memory cell. A sense amplifier is connected to the bit line pair. The sense amplifier is supplied with a second driving voltage that is lower than the first driving voltage. A control logic selects a pre-charge voltage from the first and second driving voltages, pre-charges the bit line pair to the pre-charge voltage and adjusts the pre-charged voltage to a target voltage.

20 Claims, 23 Drawing Sheets

STATIC RANDOM ACCESS MEMORY DEVICE INCLUDING DUAL POWER LINE AND BIT LINE PRECHARGE METHOD THEREOF

CROSS-REFERENCE TO RELATED APPLICATION

This application claims priority under 35 U.S.C. §119 to Korean Patent Application No. 10-2013-0104369, filed on Aug. 30, 2013 in the Korean Intellectual Property Office, the disclosure of which is incorporated by reference herein in its entirety.

TECHNICAL FIELD

The present inventive concept relates to a static random access memory (SRAM) device including a dual power line and a bit line pre-charge method thereof.

DISCUSSION OF RELATED ART

Mobile devices include system on chip (SoC) devices to reduce theft size. SoC devices include many functional units such as a static random access memory (SRAM) unit. Such SRAM unit is used as a cache or a buffer memory in the SoC devices. To reduce power consumption, a low driving voltage is used for mobile devices. When the SRAM unit in SoC is powered using the low driving voltage, a memory cell in the SRAM unit may be unstable, and the SRAM unit is difficult to operate in a high-speed due to a slow sensing operation. The SRAM unit may be packaged in a stand-along device, and be incorporated in mobile devices and/or various computing systems.

SUMMARY

According to an exemplary embodiment of the present inventive concept, a static random access memory (SRAM) device is provided. A memory cell is supplied with a first driving voltage. A bit line pair is connected to the memory cell. A sense amplifier is connected to the bit line pair. The sense amplifier is supplied with a second driving voltage that is lower than the first driving voltage. A control logic selects a pre-charge voltage from the first and second driving voltages, pre-charges the bit line pair to the pre-charge voltage and adjusts the pre-charged voltage to a target voltage.

According to an exemplary embodiment of the present inventive concept, a method of performing a bit line pre-charge method in an SRAM device is provided. A first driving voltage is provided to a memory cell. A second driving voltage is provided to a sense amplifier. The second driving voltage is lower than the first driving voltage. One of the first and second driving voltages is selected as a pre-charge voltage. The pre-charge voltage is provided to a bit line pair connected to the memory cell. The pre-charge voltage is adjusted to a target voltage before a sensing operation starts.

According to an exemplary embodiment of the present inventive concept, a static random access memory (SRAM) device is provided. The SRAM device includes a memory cell connected to a bit line pair and electrically supplied with a first driving voltage. A pre-charge voltage source is electrically coupled to one end of the bit line pair. A sense amplifier is electrically coupled to an opposite end of the bit line pair. The sense amplifier is supplied with a second driving voltage that is lower than the first driving voltage. A control logic controls the pre-charge voltage source such that the bit line pair is pre-charged to a target voltage before the sense amplifier starts a sensing operation.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
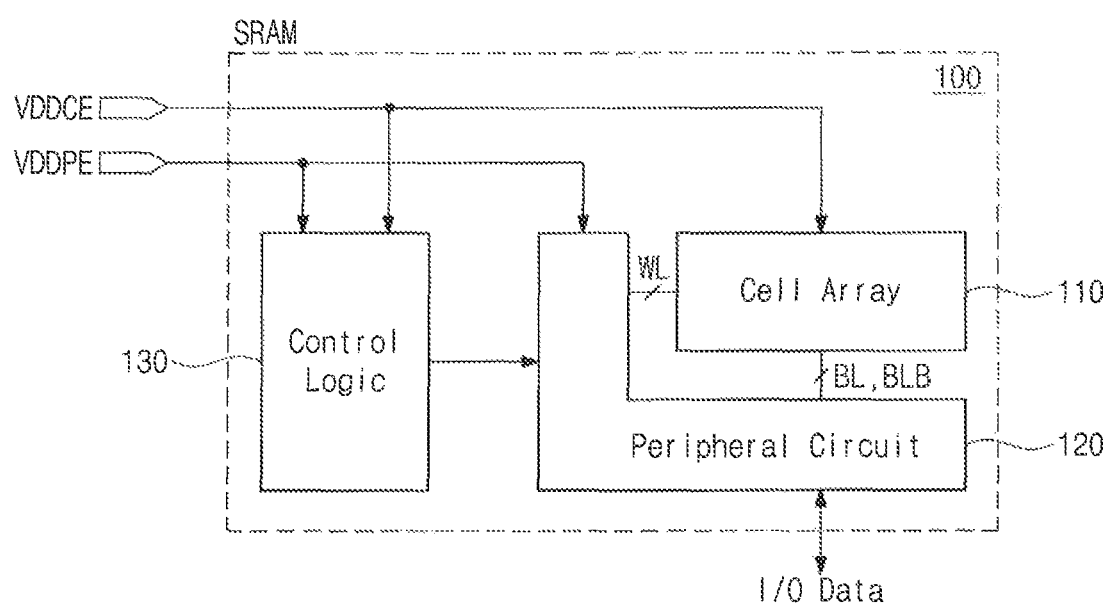
FIG. 1 is a block diagram illustrating an SRAM device according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings. The "device" may refer to a function unit in a system on a chip (SoC) device and/or a stand-alone device.

FIG. 1 is a block diagram illustrating an SRAM device according to an exemplary embodiment of the inventive concepts. The SRAM device 100 includes a cell array 110, a peripheral circuit 120, and a control logic 130.

The cell array 110 includes memory cells connected to word lines WL and bit lines BL. Each memory cell is accessed through a word line and a bit line. Each memory cell selected by a word line is connected to a bit line pair BL and BLB. Each memory cell includes a latch circuit and path transistors whose gate voltages correspond to a voltage of a word line. During a sensing operation, a voltage difference between the bit line pair BL and BLB is developed according to data stored in the latch circuit. Data is determined by sensing the voltage difference between the bit line pair BL and BLB. Latch circuits of the memory cells included in the cell array 110 are supplied with a first driving voltage VDDCE such that data of the latch circuits of the memory cells are maintained.

The peripheral circuit 120 includes control circuits for driving the word lines WL and the bit lines BL of the cell array 110. For example, the peripheral circuit 120 includes a row decoder for selecting the word lines WL of the cell array 110. The peripheral circuit 120 includes a sense amplifier for detecting the voltage difference between the bit line pair connected to a memory cell of a selected row and a write driver for writing data through the bit line pair.

The peripheral circuit 120 includes a pre-charge circuit for pre-charging the bit line pair of a memory cell selected in a read operation. The pre-charge circuit pre-charges the bit line pair according to a control of the control logic 130. The peripheral circuit 120 pre-charges a bit line using a second driving voltage VDDPE. The peripheral circuit 120 also includes various components such as a pull-up/pull-down circuit for adjusting a bit line to a target voltage VBE_opt or to a level higher than a minimum pre-charge voltage VBL_low, a shift circuit, and so on. This will be more fully described with reference to the following embodiments.

The control logic 130 monitors levels of the first and second driving voltages VDDCE and VDDPE. When a level of the second driving voltage VDDPE is lower than a predetermined voltage, the control logic 130 performs a pre-charge voltage control operation on a bit line pair such that the pre-charge voltage o is controlled to be higher than the pre-determined voltage (e.g., a minimum pre-charge voltage). For example, when the second driving voltage VDDPE is lower than the predetermined voltage, the control logic 130 adjusts the pre-charged voltage of a bit line to a target voltage VBL_opt although the second driving voltage VDDPE is lower than the predetermined value.

The predetermined voltage may be a minimum pre-charge voltage below which a sense amplifier is unable to detect a data stored in a memory cell in a read operation. The target voltage may be a pre-charge voltage whose voltage level is higher than the predetermined voltage and between the first and second driving voltages VDDCE and VDDPE. When a bit line pair BL and BLB is precharged with the target voltage, a sense amplifier may detect a data stored in a memory cell regardless of the voltage level in the second driving voltage VDDPE supplied to the peripheral circuit 120.

According to an exemplary embodiment, a target voltage is provided to precharge a bit line pair BL and BLB regardless of the voltage level in the second driving voltage VDDPE. The second driving voltage VDDPE is provided to the peripheral circuit 120 of the SRAM device 100. Accordingly, the SRAM device 100 using a dual power supply scheme may secure a read operation margin when the second driving voltage VDDPE is lowered below the predetermined voltage for a pre-charge operation.

Figure 2A:
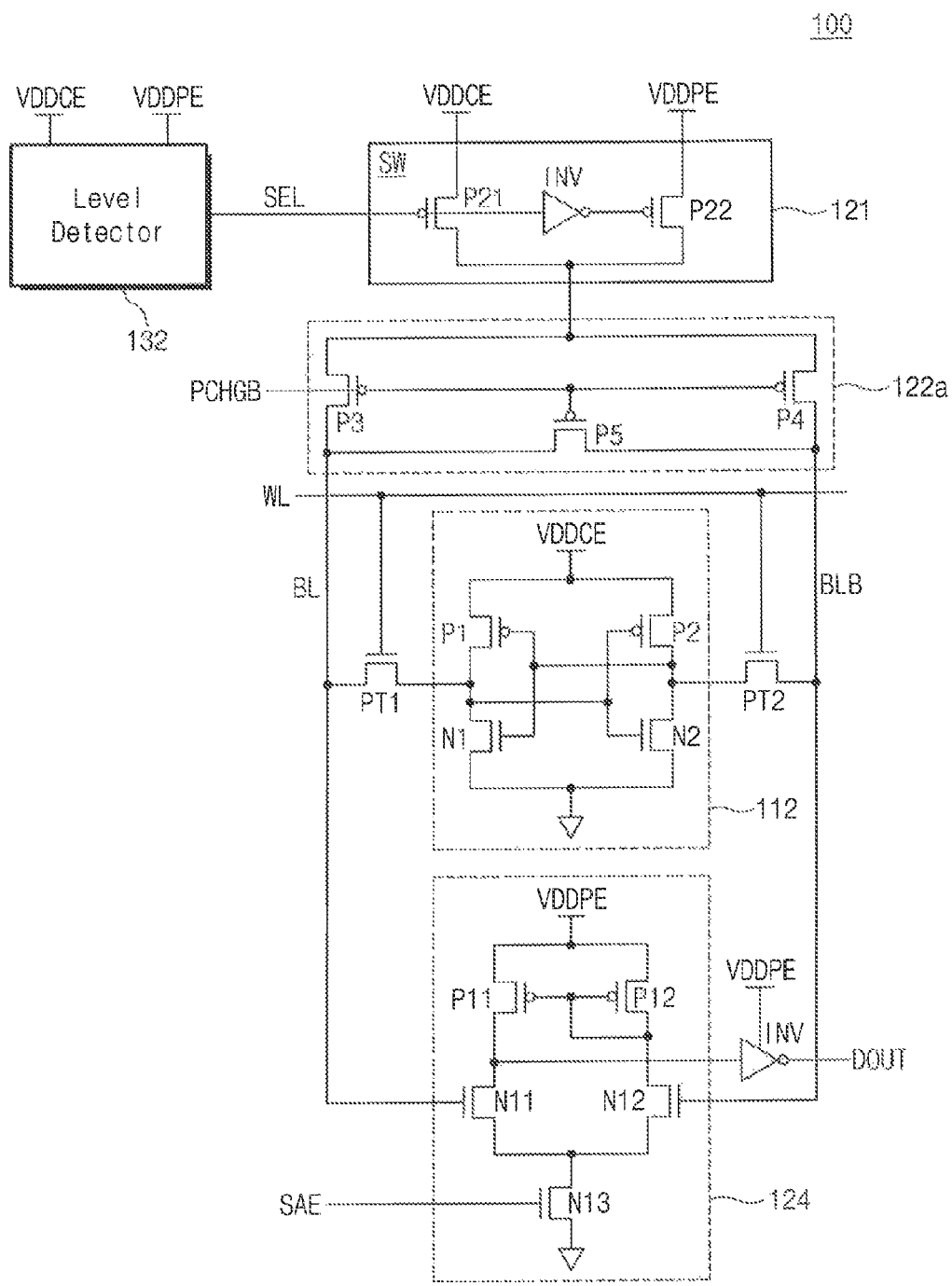
FIGS. 2A and 2B are circuit diagrams showing an SRAM according to an exemplary embodiment of the present inventive concept.
Figure 2B:
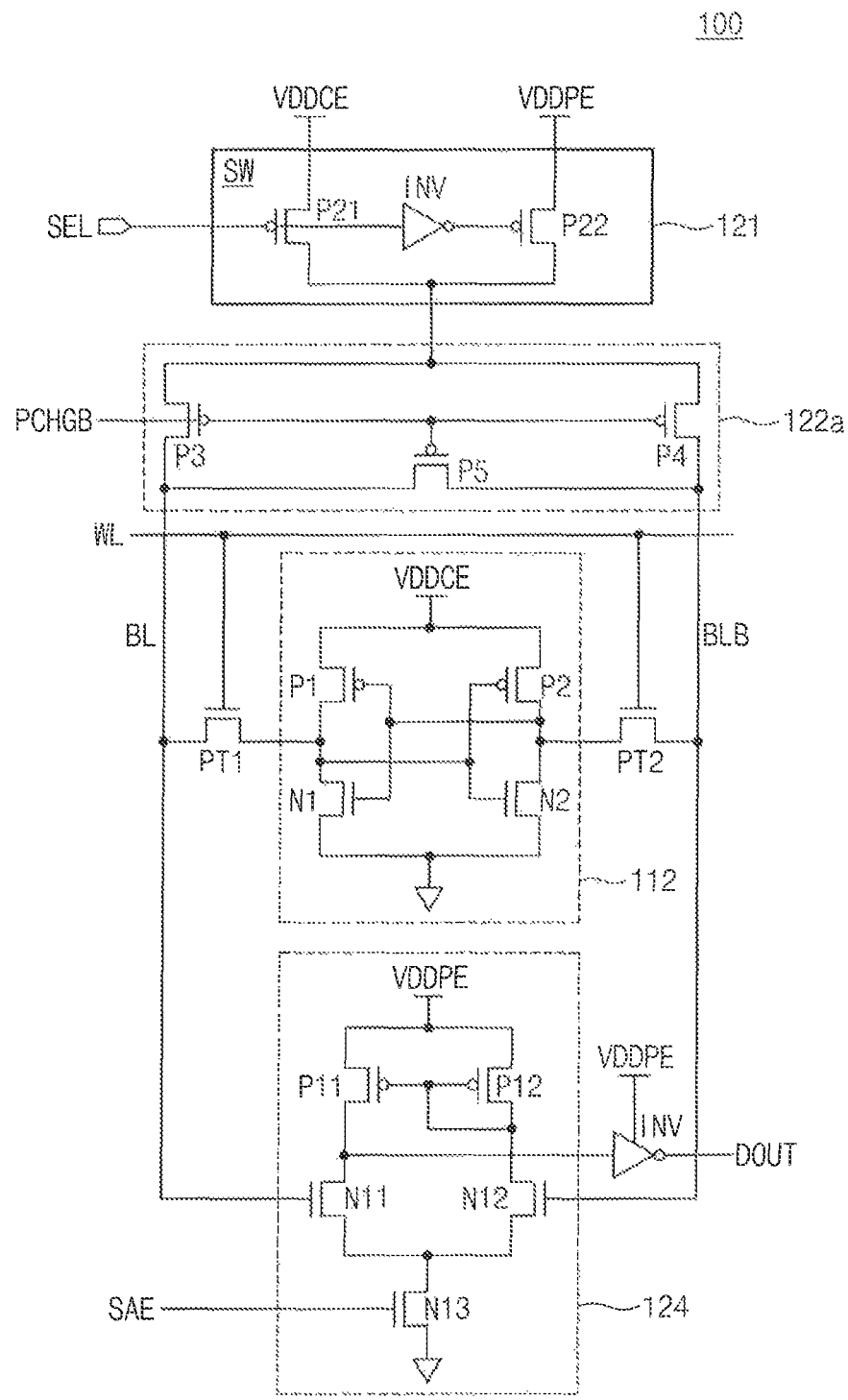

FIGS. 2A and 2B are circuit diagrams showing SRAM devices according to exemplary embodiments of the inventive concept. Referring to FIG. 2A, the SRAM device 100 includes a level detector 132 and a power switch 121. The level detector 132 is included in the control logic 130 of FIG. 1. The SRAM device 100 further includes a memory cell 112, a pre-charge/equalization circuit 122a and a sense amplifier 124. Here, the power switch 121, the pre-charge/equalization circuit 122a and the sense amplifier 124 are included in the peripheral circuit 120 of FIG. 1. However, it is understood that the above-described components are included in the peripheral circuit 120 or the control logic 130.

The memory cell 112 is a 1-port SRAM cell formed of four transistors. The memory cell 112 includes a first inverter formed of a P-type Metal-Oxide-Semiconductor (PMOS) transistor P1 and an N-type Metal-Oxide-Semiconductor (NMOS) transistor N1. The memory cell 112 further includes a second inverter formed of a PMOS transistor P2 and an NMOS transistor N2. The output node of the first inverter is connected to the input node of the second inverter, and the output node of the second inverter is connected to the input node of the first inverter. The memory cell 112 is connected to a bit line and a word line through path transistors PT1 and PT2. Gates of the path transistors PT1 and PT2 are connected to a word line WL. When a selection voltage is applied to the word line WL, the path transistors PT1 and PT2 are turned on, and the memory cell 112 formed of the first and second inverters are connected to a bit line pair BL and BLB.

The memory cell 112 is connected to a first driving voltage VDDCE as a cell voltage. For example, the common source node of the PMOS transistors P1 and P2 is supplied with the first driving voltage VDDCE. Thus, the memory cell 112 is supplied with a relatively high driving voltage VDDCE regardless of a driving mode of the SRAM device 100.

The pre-charge/equalization circuit 122a pre-charges and equalizes the bit line pair BL and BLB in response to a pre-charge control signal PCHGB. The pre-charge/equalization circuit 122a transfers a voltage provided from the power switch 121 to the bit line pair BL and BLB. This function is performed by PMOS transistors P3 and P4. The pre-charge/equalization circuit 122a equalizes levels of the bit line pair BL and BLB to have substantially the same voltage. Equalization is made by connecting the bit line pair BL and BLB through a PMOS transistor P5. The pre-charge/equalization circuit 122a performs pre-charge and equalization operations in response to the pre-charge control signal PCHGB.

The sense amplifier 124 detects a voltage difference between the bit line pair BL and BLB to read a data stored in the memory cell 112 in a read operation. The sense amplifier 124 includes PMOS transistors P11 and P12 and NMOS transistors N11 and N12. The output of the sense amplifier 124 is connected to an inverter INV. For example, the drain of the PMOS transistor P11 (or the drain of the NMOS transistor N11) is connected to the input of the inverter INV. The gates of the PMOS transistors P11 and P12 are commonly connected to the drain of the PMOS transistor P12 (or the drain of the NMOS transistor N12). The sources of the NMOS transistors N11 and N12 are selectively grounded through a selection transistor N13 for activating the sense amplifier 124 in response to a sense amplifier enable signal SAE. For example, the sense amplifier enable signal SAE is activated, the drains of the NMOS transistors N11 and N12 are discharged through the selection transistor N13 to a ground in different speeds according to the voltage difference between the bit line pair BL and BLB. Accordingly, the sense amplifier 124 performs a sensing operation based on the voltage difference between the bit line pair BL and BLB if the second driving voltage VDDPE is lower than the predetermined voltage.

Here, the sense amplifier 124 is connected to the second driving voltage VDDPE as a power supply voltage. For example, the second driving voltage VDDPE is commonly supplied to the sources of the PMOS transistors P11 and P12. The voltage level of the second driving voltage VDDPE may be different according to an operation mode of the SRAM device 100. For example, the voltage level of the second driving voltage VDDPE is higher in a high-speed operation mode than in a low-speed operation mode. The second driving voltage VDDPE is lower than the first driving voltage VDDCE regardless of such operation modes. In the high-speed mode operation, the second driving voltage VDDPE is increased such that the sense amplifier 124 operates faster. In the low-speed mode operation, the second driving voltage VDDPE is decreased to reduce power consumption of the sense amplifier 124. However, the inventive concept is not limited thereto, and the first driving voltage VDDCE may be used as the power supply voltage of the sense amplifier 124.

If the second driving voltage VDDPE decreases below the predetermined voltage, the pre-charged voltage of the bit line pair BL and BLB is insufficient. In this case, it takes long time for the sense amplifier 124 to detect the voltage difference between the bit line pair BL and BLB or the sense amplifier 124, if operates fast, may inaccurately detect the voltage difference between the bit line pair BL and BLB.

The level detector 132 detects whether the second driving voltage VDDPE is lower than the predetermined voltage and generates a selection signal SEL according to the detection result. The predetermined voltage may be a voltage lower by about 250 mV than the first driving voltage VDDCE. The level detector 132 may detect a difference between the first driving voltage VDDCE and the second driving voltage VDDPE, and if such difference is greater than 250 mV, the level detector 132 generates the selection signal SEL for selecting the first driving power VDDCE. Otherwise, the level detector 132 generates the selection signal SEL for selecting the second driving power VDDPE. Alternatively, the level detector may compare the second driving voltage with the predetermined voltage, and if the second driving voltage is lower than the predetermined voltage, the level detector 132 generates the selection signal SEL for selecting the first driving power VDDCE. Otherwise, the level detector 132 generates the selection signal SEL for selecting the second driving power VDDPE.

The power switch 121 provides, in response to the selection signal SEL, one of the first driving voltage VDDCE and the second driving voltage VDDPE to the pre-charge/equalization circuit 122a. If the second driving voltage VDDPE is higher than the predetermined voltage (or if the difference between the first driving power VDDCE and the second driving power VDDPE is less than about 250 mV), the power switch 121 provides the second driving voltage VDDPE to the pre-charge/equalization circuit 122a. If the second driving voltage VDDPE is lower than the predetermined voltage (or if the difference between the first driving power VDDCE and the second driving power VDDPE is greater than about 250 mV), the power switch 121 provides the first driving voltage VDDCE to the pre-charge/equalization circuit 122a. Such voltage relationships will be described in detail with reference to FIGS. 3A and 3B. The power switch 121 includes PMOS transistors P21 and P22 and an inverter INV.

With the level detector 132 and the power switch 121, the bit line pair BL and BLB is pre-charged to the target voltage regardless of the second driving voltage VDDPE. The level detector 132 and the power switch 121 causes the bit line pair BL and BLB to be pre-charged with the target voltage higher than the predetermined voltage in a pre-charge operation if the second driving power VDDPE is lower than the predetermined voltage. As described above, the predetermined voltage is defined as a minimum pre-charge voltage required to perform a read operation using the sense amplifier 124.

Referring to FIG. 2B, the SRAM device 100 includes a power switch 121 that selects one of the first and second driving voltages VDDCE and VDDPE in response to the selection signal SEL. The SRAM device 100 of FIG. 2B is substantially similar to that of FIG. 2A, except that the SRAM device 100 of FIG. 2B does not include a level detector 132 as shown in FIG. 2A. For the convenience of a description, such differences will be described below.

The power switch 121 provides one of one of the first and second driving voltages VDDCE and VDDPE to the pre-charge/equalization circuit 122a in response to the selection signal SEL. The selection signal SEL may be generated based on an operation mode of the SRAM device 100. For example, if the SRAM device 100 operates in a low-speed operation mode, the selection signal SEL is logical "1" such that the second driving voltage VDDCE is selected. If the SRAM device 100 operates in a high-speed operation mode, the selection signal SEL is logic "0" such that the first driving voltage VDDPE is selected. The operation mode of the SRAM device 100 may be determined by a SRAM memory controller (not shown). Alternatively, the operation mode of the SRAM device 100 may be stored in the control logic 130.

Figure 3A:
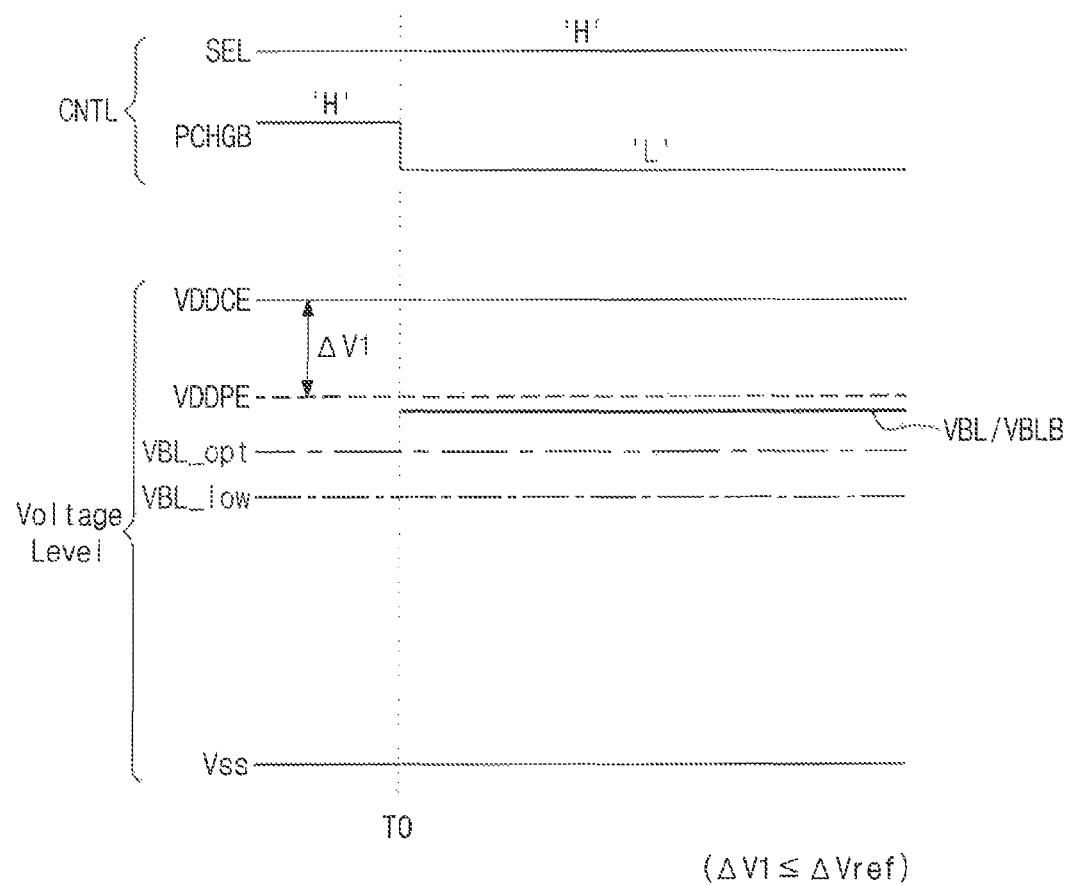
FIGS. 3A and 3B are waveform diagrams showing an operation of a power switch of FIG. 2A or 2B according to an exemplary embodiment of the present inventive concept.
Figure 3B:
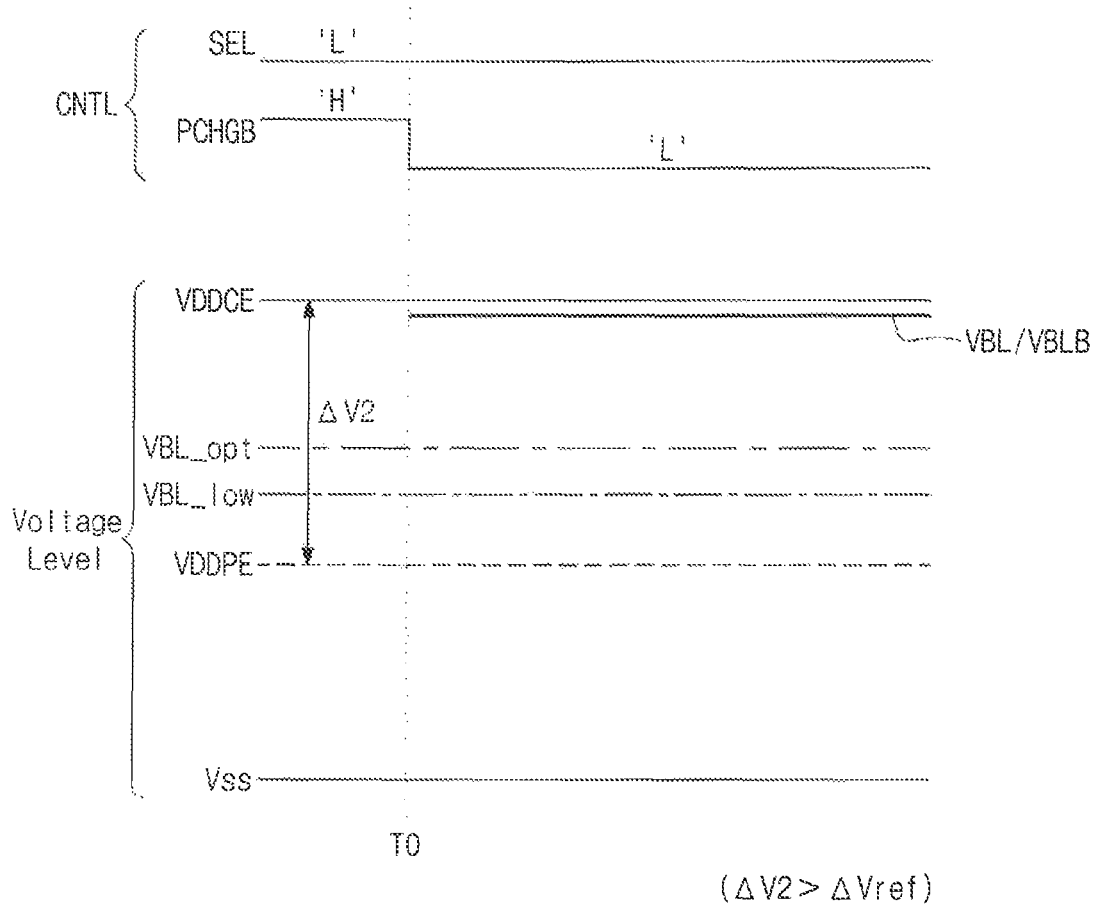

FIGS. 3A and 3B are waveform diagrams showing an operation of a power switch 121 according to a selection signal SEL shown in FIG. 2A or 2B. FIG. 3A shows that a difference ΔV1 between the first driving voltage VDDCE and the second driving voltage VDDPE is smaller than about 250 mV, for example, or that the second driving voltage VDDPE is higher than the predetermined voltage VBL_low. FIG. 3B shows that a difference ΔV2 between the first driving voltage VDDCE and the second driving voltage VDDPE is greater than about 250 mV, for example, or that the second driving voltage VDDPE is lower than the predetermined voltage VBL_low. The inventive concept is not limited thereto, and the voltage difference of the first and second driving powers VDDCE and VDDPE may be varied.

Referring to FIG. 3A, since the difference ΔV1 between the first driving voltage VDDCE and the second driving voltage VDDPE is smaller than or equal to a predetermined difference ΔVref (for example, about 250 mV), a high level of selection signal SEL is provided. For example, the level detector 132 of FIG. 2A provides a high level of selection signal SEL when the difference ΔV1 between the first driving voltage VDDCE and the second driving voltage VDDPE is smaller than the predetermined difference ΔVref. Alternatively, when the selection signal SEL is provided based on an operation mode of a system on chip, a high level of selection signal SEL is provided in a high speed operation mode, and a low level of selection signal SEL is provided in a low speed operation mode.

At T0 when a pre-charge operation starts and the selection signal has a high level, the power switch 121 transfers the second driving voltage VDDPE to the bit line pair BL and BLB. For example, if the pre-charge control signal PCHGB transitions to a low level, the pre-charge/equalization circuit 122a is activated, and the bit line pair BL and BLB is pre-charged to the second driving voltage VDDPE or a level approximating to the second driving voltage VDDPE.

Referring to FIG. 3B, the selection signal SEL is set to a low level, and the first driving voltage VDDCE is selected. The first driving voltage VDDCE, relatively higher than the second driving voltage VDDPE, serves to pre-charge the bit line pair. Alternatively, in the event that the selection signal SEL is provided based on an operation mode of the SRAM device, a low level of selection signal SEL is provided in a low speed operation mode. The bit line pair BL and BLB is precharged to the first driving voltage VDDCE or a level approximating to the first driving voltage VDDCE. If the SRAM device 100 is included in a system-on-a-chip (SOC) device, the operation mode of the SRAM device 100 may be determined on the basis of the SOC device operation mode.

At T0 when a pre-charge operation starts, the power switch 121 transfers the first driving voltage VDDCE to the pair of bit lines BL and BLB. For example, if the pre-charge control signal PCHGB transitions to a low level, the pre-charge/equalization circuit 122a is activated, and the bit line pair BL and BLB is pre-charged to the first driving voltage VDDCE or a level approximating to the first driving voltage VDDCE. Although the second driving voltage VDDPE is lowered below predetermined voltage VBL_low, a pre-charge technique of the inventive concept allows the bit line pair BL and BLB to be pre-charged with the second driving voltage VDDPE that is higher than the predetermine voltage VBL_low.

According to an exemplary embodiment, the first and second driving voltages VDDCE and VDDPE are selectively supplied to pre-charge a bit line pair BL and BLB based on the voltage level of the second driving voltage VDDPE. For example, if the second driving voltage VDDPE is higher than the predetermined voltage VBL_low, the second driving voltage VDDPE is supplied to pre-charge the bit line pair BL and BLB; if the second driving voltage VDDPE is equal to or lower than the predetermined voltage VBL_low, the first driving voltage VDDCE is supplied to pre-charge the bit line pair BL and BLB. Thus, read disturbance is reduced when the second driving voltage VDDPE is lowered, and thus a read operation may secure a read operation margin.

The inventive concept is not limited thereto, and the bit line pair BL and BLB may be pre-charged to various voltage levels regardless of a manner where a driving voltage is supplied. This will be described in detail with reference to accompanying drawings.

Figure 4:
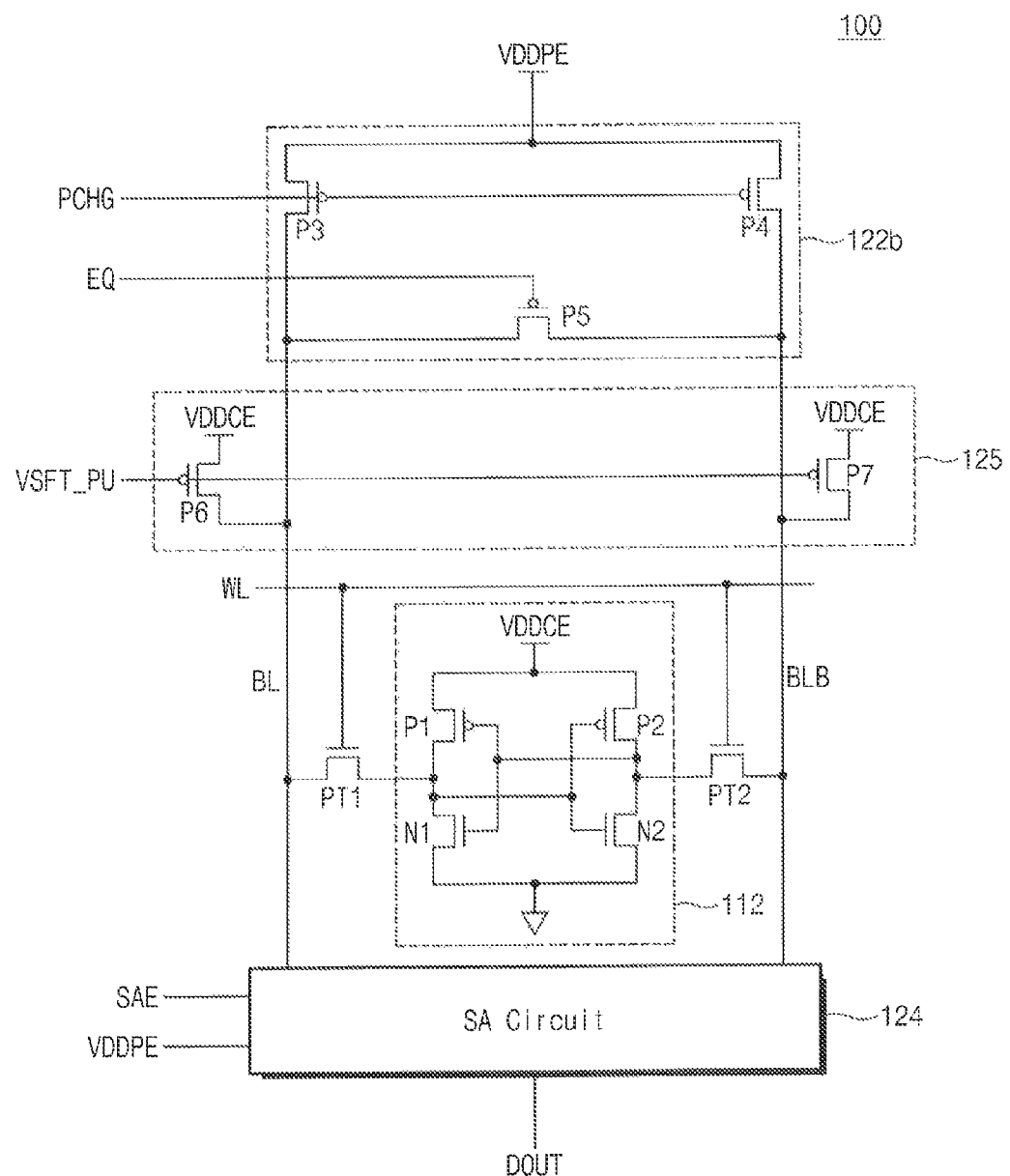
FIG. 4 is a circuit diagram illustrating a pre-charge circuit according to an exemplary embodiment of the present inventive concept.

FIG. 4 is a circuit diagram illustrating an SRAM device according to an exemplary embodiment of the inventive concept. Referring to FIG. 4, a pre-charge/equalization circuit 122b, a sense amplifier 124 and a shift circuit 125 are included in the peripheral circuit 120 of FIG. 1. A memory cell 112 is included in the memory cell array 110 of FIG. 1. The shift circuit 125 serves to adjust the pre-charged voltage of the bit line pair BL and BLB during a pre-charge operation. The memory cell 112 and the sense amplifier 124 are substantially the same as those shown in FIG. 2, and the description thereof is thus omitted.

The pre-charge/equalization circuit 122b includes PMOS transistors P3 and P4 for providing a second driving voltage VDDPE to the bit line pair BL and BLB in response to a pre-charge control signal PCHG. The pre-charge/equalization circuit 122b further includes a PMOS transistor P5 for electrically connecting the bit line pair BL and BLB to each other in response to an equalization signal EQ.

The shift circuit 125 includes PMOS transistors P6 and P7 for providing a first driving voltage VDDCE to the bit line pair BL and BLB in response to a pull-up signal VSFT_PU during a pre-charge operation. For example, the first driving voltage VDDCE is provided to the sources of the PMOS transistors P6 and P7 of the shift circuit 125. The drains of the PMOS transistors P6 and P7 are connected to the bit line pair BL and BLB, respectively. During a bit line pre-charge operation interval, the PMOS transistors P6 and P7 pre-charge the bit line pair BL and BLB to the first driving voltage VDDCE in response to the pull-up signal VSFT_PU.

Figure 5:
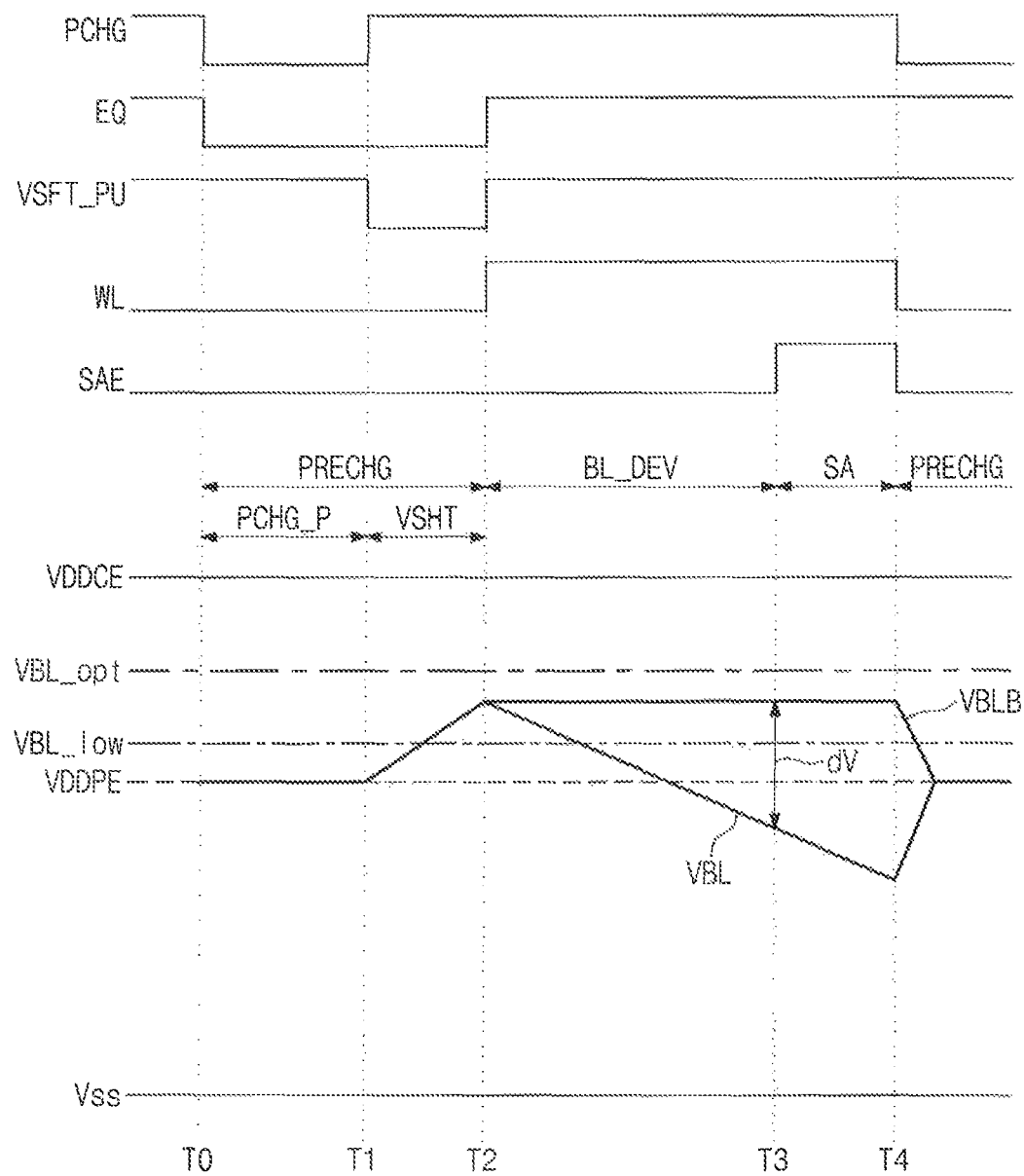
FIG. 5 is a waveform diagram illustrating a bit line pre-charge operation of the SRAM device in FIG. 4, according to an exemplary embodiment of the present inventive concept.

During a pre-charge operation, the bit line pair BL and BLB is first pre-charged by the second driving voltage VDDPE, and then the pre-charged voltage of the bit line pair BL and BLB is adjusted to the target voltage by the shift circuit 125. Accordingly, the pre-charge voltage of the bit line pair BL and BLB is pre-charged to the target voltage when the second driving power VDDPE is lower than the predetermined voltage VBL_low of FIG. 5. FIG. 5 is a waveform diagram illustrating a bit line pre-charge operation performed in the SRAM device of FIG. 4, according to an exemplary embodiment of the inventive concept. Referring to FIG. 5, the bit line pair BL and BLB is pre-charged to a voltage higher than the predetermined voltage VBL_low before a sensing operation starts, when the second driving voltage VDDPE is lower than the predetermined voltage VBL_low.

At T0, an operation of pre-charging a bit line starts. First, a pre-charge control signal PCHG and an equalization signal EQ transition to a low level. At this time, a second driving voltage VDDPE provided as a power supply voltage of a peripheral circuit 120 is provided to the bit line pair BL and BLB. The bit line pair BL and BLB is pre-charged to the second driving voltage VDDPE through the pre-charge/equalization circuit 122b. Here, the second driving voltage VDDPE is lower than the predetermined voltage VBL_low.

At T1, the pre-charged voltage of the bit line pair BL and BLB starts to be adjusted toward a voltage lower than the target voltage VBL_opt through the shift circuit 125. At this time, the pre-charge control signal PCHG transitions to a high level, and the pull-up signal VSFT_PU transitions to a low level. Accordingly, the second driving voltage VDDPE is not provided to the bit line pair BL and BLB, and the first driving voltage VDDCE is provided to the bit line pair BL and BLB. The equalization signal EQ is kept to the low level during a shift period between T1 and 12. The voltage of the bit line pair BL and BLB is increased to a voltage level higher than the predetermined voltage VBB_low at T2. The pre-charged voltage of the bit line pair BL and BLB is adjusted to a voltage higher than the predetermined voltage VBL_low.

At T2, word line WL (or word line signal applied to the word line WL) transitions to a high level for a read operation, and path transistors PT1 and PT2 are turned on in response to the word line signal. Data stored in a memory cell 112 is transferred to the bit line pair BL and BLB through the path transistors PT1 and PT2. The bit line pair BL and BLB is pre-charged to the voltage level higher than the predetermined voltage VBL_low using the pre-charge/equalization circuit 122b and the shift circuit 125. For the convenience of a description, the memory cell 112 is assumed to store logical "0" where a cell node A has a low voltage level and a cell node B has a high voltage level. In that case, the pre-charged bit line BL is connected to a cell node A (low voltage) through the path transistor PT1 and thus the voltage of the bit line BL decreases due to discharging through charge sharing between the cell node A and the bit line BL. The pre-charged bit line BLB is connected to a cell node B (high voltage) through the path transistor PT2 and thus the voltage of the bit line BLB is less changed compared to the bit line BL or kept substantially similar to the pre-charged voltage, because a charge sharing occurs between the cell node B having high voltage and the bit line BLB. Such voltage disparity due to the charge sharing cause the pull-down NMOS transistor N1 and N2 to discharge the cell node A and B in different speeds. Since the pull-down NMOS transistor N1 is coupled to the cell node B and the pull-down NMOS transistor N2 is coupled to the cell node A, the pull-down NMOS transistor N1 discharges the cell node A faster than the pull-down NMOS transistor N2 discharges the cell node B. The interval for which a voltage difference between the bit line pair BL and BLB is increased is referred to as a bit line develop interval BL_DEV.

At T3, a sense amplifier enable signal SAE transitions to a high level such that a selection transistor N13 of FIG. 2 is turned on. At this time, a ground path of a sense amplifier 124 is activated, so that a sensing operation starts. The sensing operation of the sense amplifier 124 includes detecting a voltage difference dV between the bit line pair BL and BLB. In the event that such voltage difference dV is not sufficiently high, the sensing margin of the sense amplifier 124 is reduced and the sensing operation of the sense amplifier 124 becomes slow of fails. For example, a transition of the sense amplifier 124 to a bi-stable state is slow. On the other hand, in the event that the voltage difference dV is sufficient, the sensing operation of the sense amplifier 124 is performed fast and thus the sensing execution interval of the sense amplifier 124 is shortened. Thus, the SRAM device operates fast.

At T4, the pre-charge control signal PCHG, the word line WL, and the sensing enable signal SAE transition to a low level. Under this condition, the path transistors PT1 and PT2 are turned off, and a pre-charge operation is performed on the bit line pair BL and BLB.

According to an exemplary embodiment, the pre-charged voltage of the bit lines BL and BLB is increased to a voltage higher than the second driving voltage VDDPE, before the word line WL is activated. Thus, the sense amplifier 124 may secure a sensing margin when the second driving voltage VDDPE is lower than the predetermined voltage VBL_low.

Figure 6:
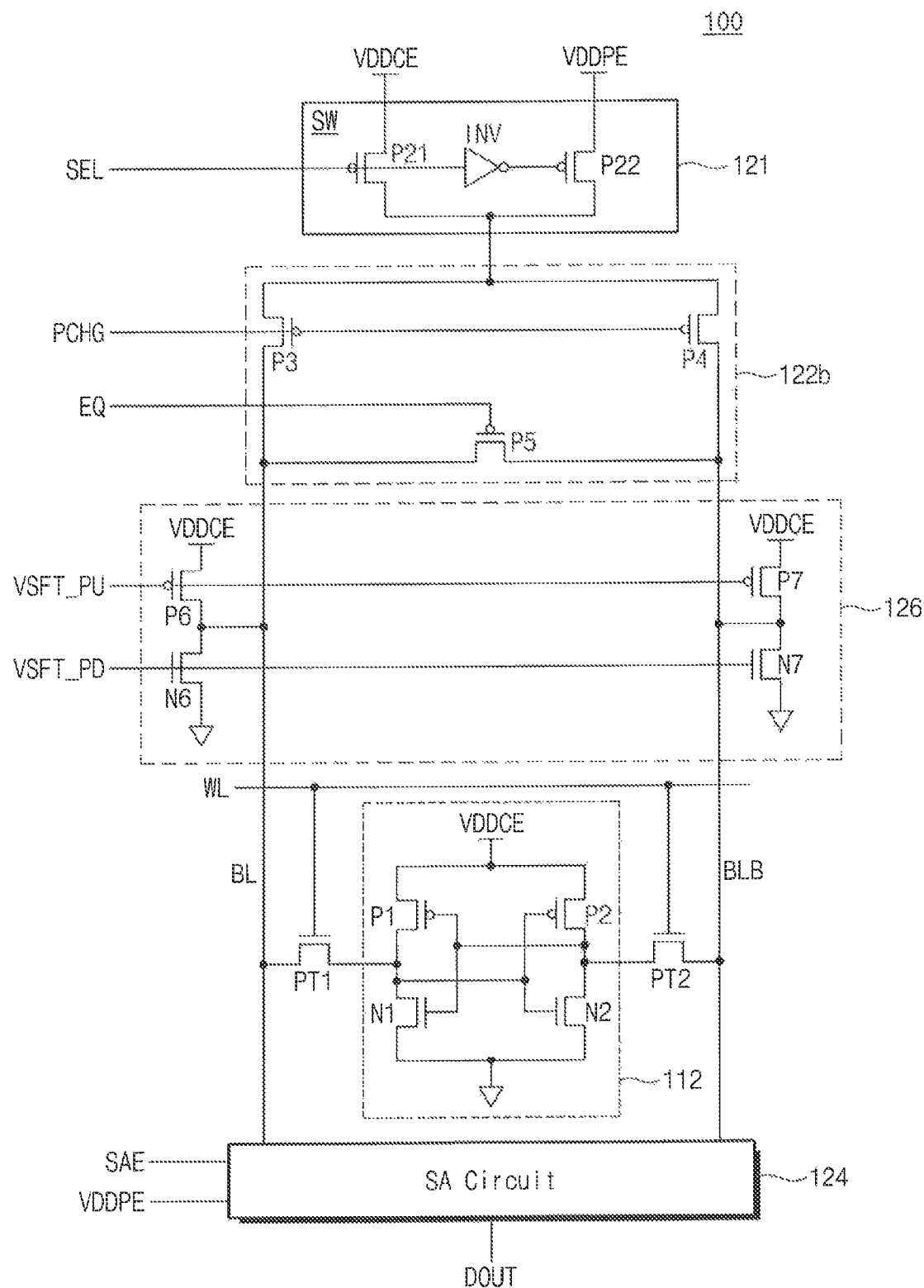
FIG. 6 is a circuit diagram illustrating an SRAM according to an exemplary embodiment of the present inventive concept.

FIG. 6 is a circuit diagram illustrating an SRAM device according to an exemplary embodiment of the inventive concept. Referring to FIG. 6, the SRAM device 100 of FIG. 1 includes a power switch 121, a pre-charge/equalization circuit 122b, and a pull-up/pull-down circuit 126. The power switch 121 and the pre-charge/equalization circuit 122b pre-charges a bit line pair BL and BLB to one of a first driving voltage VDDCE and a second driving voltage VDDPE during a pre-charge operation. The power switch 121 and the pre-charge/equalization circuit 122b pre-charges the bit line pair BL and BLB to the target level VBL_opt, from among the first driving voltage VDDCE and the second driving voltage VDDPE. The pull-up/pull-down circuit 126 adjust the pre-charged voltage of the bit line pair BL and BLB to the target level VBL_opt. Here, a memory cell 112, the pre-charge/equalization circuit 122b, and a sense amplifier 124 are substantially the same as those shown in FIG. 2 or 4, and the description thereof is thus omitted.

The bit line pair BL and BLB is first pre-charged to the first driving voltage VDDCE or the second driving voltage VDDPE. A circuit used by a current path with a ground is minimized by first pre-charging the bit line pair BL and BLB to the first driving voltage VDDCE or the second driving voltage VDDPE. This means that power consumption is reduced.

The power switch 121 provides one of the first driving voltage VDDCE and the second driving voltage VDDPE to the pre-charge/equalization circuit 122b in response to a selection signal SEL. Here, the selection signal SEL is provided such that a difference between a pre-charged voltage initially supplied to the bit line pair BL and BLB and the target voltage VBL_opt is relatively small. For example, the selection signal SEL is controlled to provide the first driving power VDDCE when the second driving power VDDPE is low. Alternatively, the selection signal SEL may be generated based on an operation mode of the SRAM device 100.

The pull-up/pull-down circuit 126 includes PMOS transistors P6 and P7 that increase the pre-charged voltage of the bit line pair BL and BLB in response to a pull-up signal VSFT_PU in a pre-charge operation. The pull-up/pull-down circuit 126 further includes NMOS transistors N6 and N7 that decrease the bit line pair BL and BLB in response to a pull-down signal VSFT_PD in the pre-charge operation.

The first driving voltage VDDCE is provided to sources of the PMOS transistors P6 and P7 of the pull-up/pull-down circuit 126. Drains of the PMOS transistors P6 and P7 are connected to the bit line pair BL and BLB, respectively, during a bit line pre-charge interval, the PMOS transistors P6 and P7 pull up voltages of the bit line pair BL and BLB in response to the pull-up signal VSFT_PU. The adjusted pre-charged voltage (pull-up voltage level) of the bit line pair BL and BLB is determined according to the duration for which the pull-up signal VSFT_PU is activated. The longer the duration of the pull-up signal VSFT_PU is, the higher adjusted pre-charge voltage the bit line pair BL and BLB has.

The drains of the NMOS transistors N6 and N7 included in the pull-up/pull-down circuit 126 are connected to the bit line pair BL and BLB, respectively. The sources of the NMOS transistors N6 and N7 are grounded to provide a pull-down path. During the bit line pre-charge interval, the NMOS transistors N6 and N7 discharge the bit line pair BL and BLB in response to the pull-down signal VSFT_PD. Pull-down voltage level of the bit line pair BL and BLB are controlled during the duration where the pull-down signal VSFT_PD is activated.

If the power switch 121 supplies the first driving voltage VDDCE to the bit line pair BL and BLB, the control logic 130 of FIG. 1 may lower the pre-charge voltage of the bit line pair BL and BLB to the target voltage VBL_opt using the pull-down signal VSFT_PD. If the power switch 121 supplies the second driving voltage VDDPE to the bit line pair BL and BLB, the control logic 130 increases the pre-charge voltage to the target voltage VBL_opt using the pull-up signal VSFT_PU.

The power switch 121 and the pre-charge/equalization circuit 122b causes the bit line pair BL and BLB to be pre-charged to the target voltage VBL_opt before the word line is activated. The pull-up/pull-down circuit 126 adjusts the bit line pair BL and BLB to the optimal level VBL_opt. This pre-charge manner may reduce a pre-charging operation time and a power consumption when the bit line pair BL and BLB is pre-charged.

Figure 7:
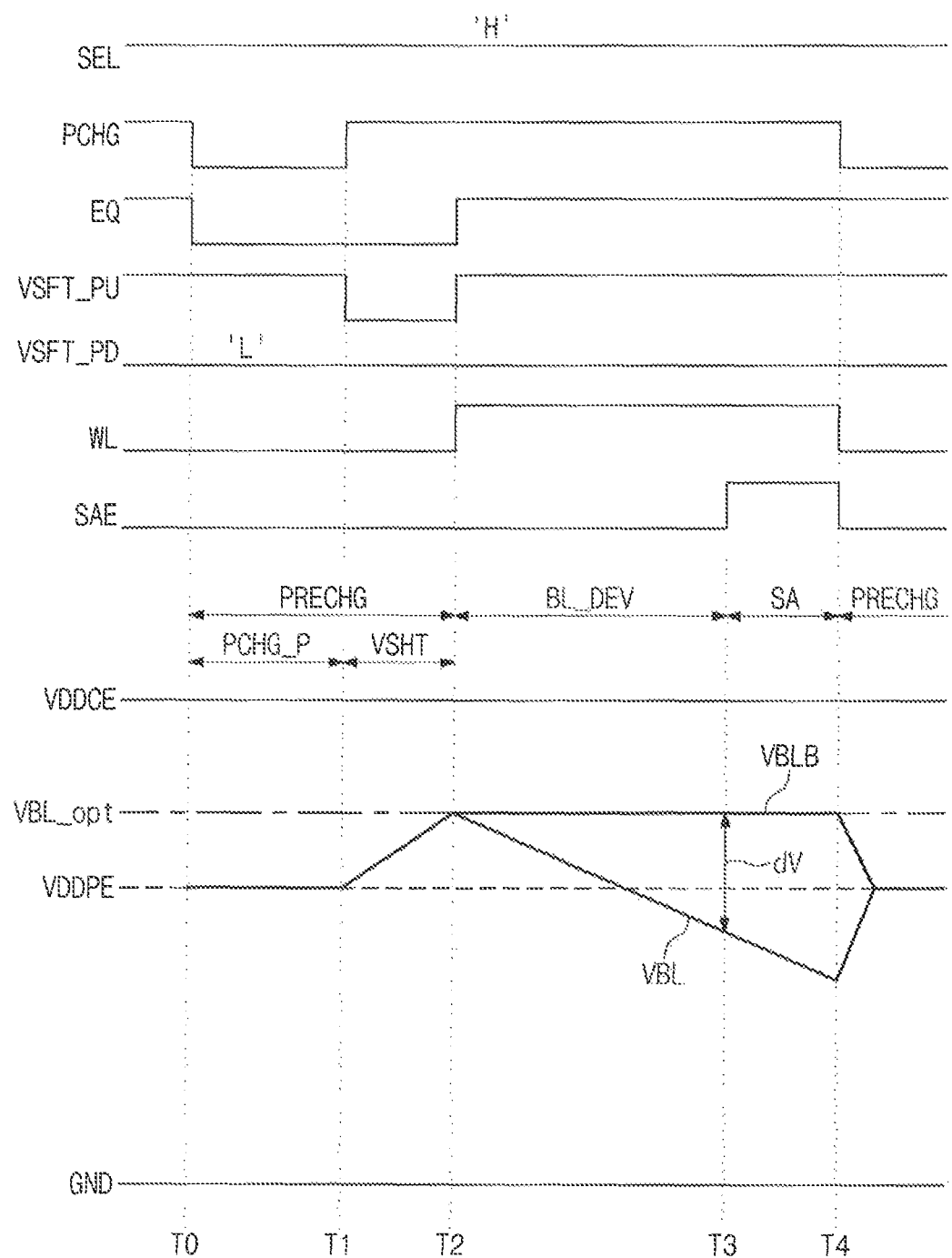
FIG. 7 is a waveform diagram illustrating a bit line pre-charge operation of the SRAM device in FIG. 6, according to an exemplary embodiment of the present inventive concept.

FIG. 7 is a waveform diagram illustrating a bit line pre-charge operation performed in the SRAM device of FIG. 6, according to an exemplary embodiment of the inventive concept. Referring to FIG. 7, during a sensing operation, the bit line pair BL and BLB is pre-charged to the target voltage VBL_opt in a high-speed and low-speed operation modes regardless of the level of the first driving voltage VDDCE or the second driving voltage VDDPE. It is assumed that a selection signal SEL provided to a power switch 121 has a high level. The bit line pair BL and BLB is first pre-charged to the second driving voltage VDDPE through the power switch 121. If the selection signal SEL has a low level, the bit line pair BL and BLB is first pre-charged to the first driving voltage VDDCE.

Referring to FIG. 7, the selection signal SEL is maintained at a high level during a pre-charge operation. At T0, a bit line pre-charge operation starts by transitioning a pre-charge control signal PCHG and an equalization signal EQ to a low level. The second driving voltage VDDPE pre-charges the bit line pair BL and BLB through the pre-charge/equalization circuit 122b. The second driving voltage VDDPE is lower than the target voltage VBL_opt.

At T1, the pull-up/pull-down circuit 126, in response to a pull-up signal VSFT_PU, pulls up the pre-charged voltage of the bit line pair BL and BLB to the target voltage VBL_opt by turning on the PMOS transistors P6 and P7. The pull-up signal VSFT_PU is provided from the control logic 130 of FIG. 1. In response to the pull-up signal VSFT_PU, the bit line pair BL and BLB is electrically connected to the first driving voltage VDDCE of the pull-up/pull-down circuit 126, and thus the voltages of the bit line pair BL and BLB increase to the target voltage VBL_opt higher than the second driving voltage VDDPE. The pull-up voltage levels of the bit line pair BL and BLB is controlled according to the duration of the pull-up signal VSFT_PU. The pre-charged voltage of the bit line pair BL and BLB is increased to the target voltage VBL_opt by controlling the duration of the pull-up signal VSFT_PU.

At T2, the equalization signal EQ and the pull-up signal VSFT_PU transition to a high level. For a read operation, a word line WL transitions to a high level. At this time, path transistors PT1 and PT2 are turned on. Data stored in a memory cell 112 is transferred to the bit line pair BL and BLB through the path transistors PT1 and PT2. The bit line pair BL and BLB is pre-charged to the target voltage VBL_opt. For the convenience of a description, the memory cell 112 is assumed to store logical "0" where a cell node A has a low voltage level and a cell node B has a high voltage level. In that case, the pre-charged bit line BL is connected to the cell node A and the pre-charged bit line BLB is connected to the cell node B. Such connection between the cell nodes A and B and the pre-charged bit line BL and BLB may cause to develop a voltage difference dV between the bit lines BL and BLB before the sense amplifier signal SAE is applied.

At T3, the sense amplifier enable signal SAE transitions to a high level, and the sense amplifier 124 performs an sensing operation based on the voltage difference dV developed for an interval between T2 and T3. When the voltage difference dV is small compared to the operating margin of the sense amplifier 124, the sense amplifier 124 may fail to read the data stored in the memory cell 112. According to an exemplary embodiment, the voltage difference dV1 is developed, using the pull-up/pull-down circuit 126, between the bit line pair BL and BLB to have sufficient margin at a time when the sense amplifier 124 performs a sensing operation.

At T4, the pre-charge control signal PCHG, the word line WL and the sensing enable signal SAE transition to a low level. At this time, the path transistors PT1 and PT2 are turned off and an operation of pre-charging the bit line pair BL and BLB is performed.

If the selection signal SEL has a low level, the bit line pair BL and BLB is first pre-charged to the first driving voltage VDDCE and then the pre-charged voltage of the bit line pair BL and BLB is decreased to the target voltage VBL_opt through a pull-down operation. For example, the pull-down operation may be performed using pull-down transistors N6 and N7.

Figure 8:
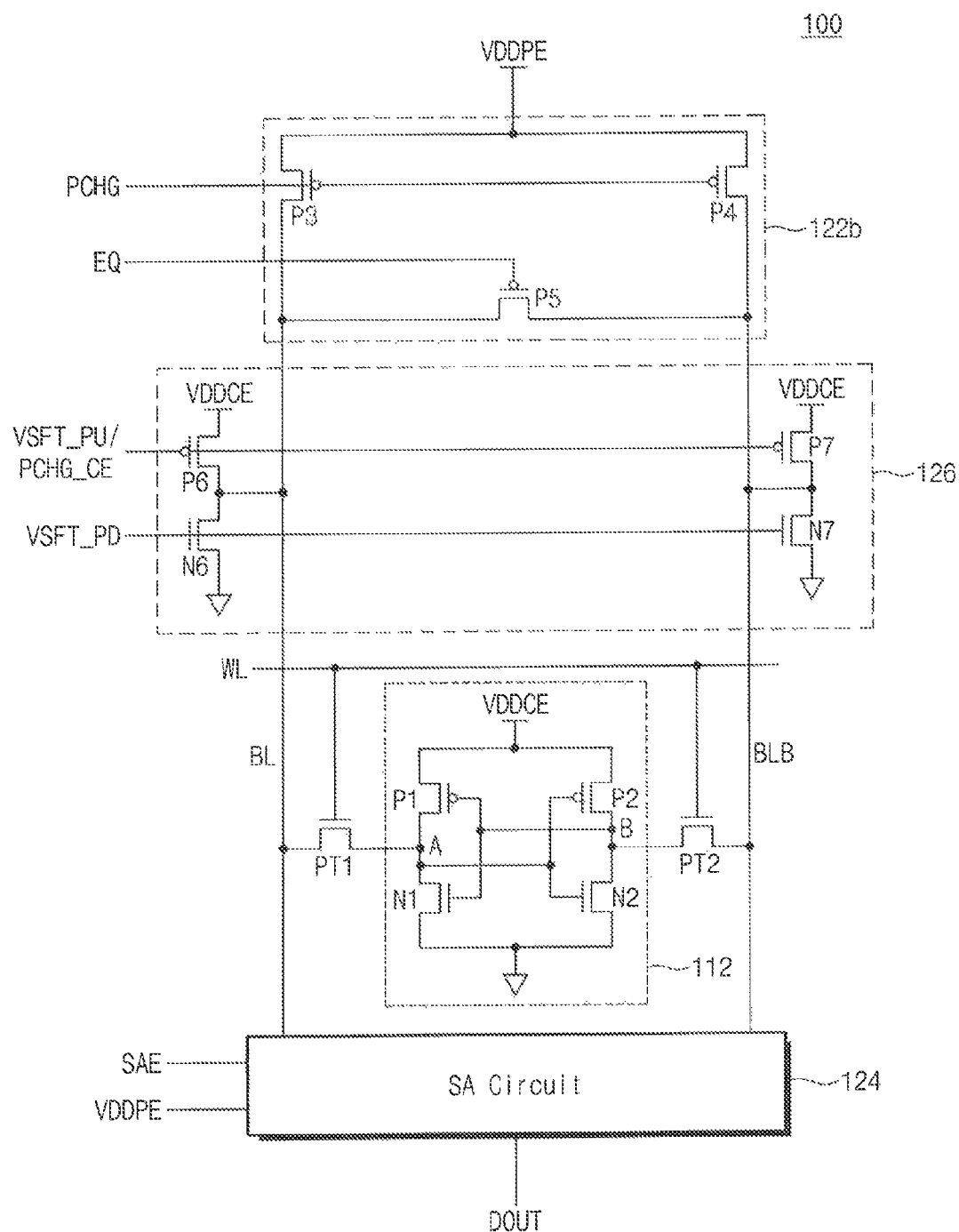
FIG. 8 is a circuit diagram illustrating an SRAM according to an exemplary embodiment of the present inventive concept.

FIG. 8 is a circuit diagram illustrating an SRAM device according to an exemplary embodiment of the inventive concept. The SRAM device of FIG. 8 is substantially similar to that of FIG. 6, except that the SRAM device of FIG. 8 does not include the power switch 121 of FIG. 6. Referring to FIG. 8, the SRAM device 100 of FIG. 1 includes a pre-charge/equalization circuit 122b and a pull-up/pull-down circuit 126 that control voltages of a bit line pair BL and BLB during a pre-charge operation. Here, a memory cell 112, the pre-charge/equalization circuit 122b and a sense amplifier 124 are substantially the same as those shown in FIG. 6, and the description thereof is thus omitted.

The bit line pair BL and BLB is first pre-charged to the second driving voltage VDDPE, and then the pre-charged voltage is adjusted to the target voltage VBL_opt through the pull-up/pull-down circuit 126. Alternatively, the first driving voltage VDDCE may be supplied to the pre-charge/equalization circuit 122b in place of the second driving voltage VDDPE. In that case, the pull-up/pull-down circuit 126 may decrease voltage levels of the bit line pair BL and BLB to the target voltage VBL_opt through a pull-down operation. For example, the pull-down operation may be performed using pull-down transistors N6 and N7.

The pull-up/pull-down circuit 126 includes PMOS transistors P6 and P7 that pull up the pre-charged voltage of the bit line pair BL and BLB in response to a control signal VSFT_PU/PCHG_CE during a pre-charge operation. During a bit line pre-charge interval, the PMOS transistors P6 and P7 pull up the pre-charged voltage of the bit line pair BL and BLB in response to the control signal VSFT_PU/PCHG_CE. For example, a pull-up operation of the bit line pair BL and BLB and a pre-charge operation to the first driving voltage VDDCE are performed for the duration of the control signal VSFT_PU/PCHG_CE. For example, the control signal VSFT_PU/PCHG_CE is activated when the pre-charge control signal PCHG is deactivated. The equalization signal EQ remains activated for the duration of the control signal VSFT_PU/PCHG_CE. If a control of the control signal VSFT_PU/PCHG_CE is implemented, a pre-charge speed of the bit line pair BL and BLB is increased through a simplified structure.

The SRAM device 100 of FIG. 8 first pre-charges the bit line pair BL and BLB to the first driving voltage VDDCE or the second driving voltage VDDPE and then adjusts the pre-charged voltage to the target voltage VBL_opt, without using the power switch 121 of FIG. 6. Thus, the SRAM device 100 of FIG. 8 may include less number of transistors, compared to the SRAM device of FIG. 6.

Figure 9:
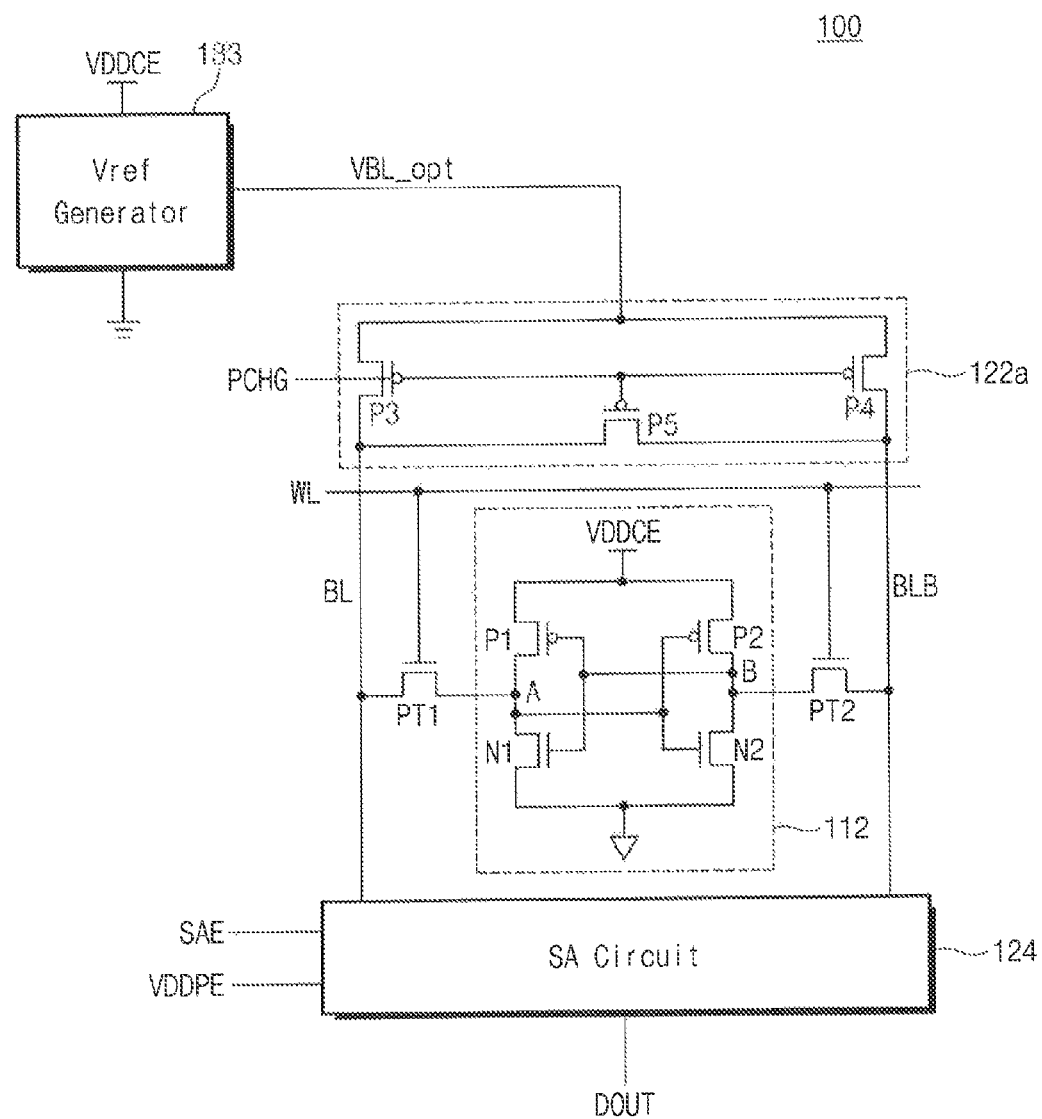
FIG. 9 is a circuit diagram illustrating an SRAM according to an exemplary embodiment of the present inventive concept.

FIG. 9 is a circuit diagram illustrating an SRAM device according to an exemplary embodiment of the inventive concept. Referring to FIG. 9, the SRAM device 100 provides the target voltage VBL_opt as a pre-charge voltage source of a bit line pair BL and BLB. The SRAM device 100 includes a reference voltage generator 133. Here, a memory cell 112, a pre-charge/equalization circuit 122a, and a sense amplifier is substantially the same as those of FIG. 2, and the description thereof is thus omitted.

The reference voltage generator 133 generates the target voltage VBL_opt during a bit line pre-charge operation. The reference voltage generator 133 generates the target voltage VBL_opt using a first driving voltage VDDCE as a power supply voltage in a voltage drop manner. Alternatively, the reference voltage generator 133 may generate the target voltage VBL_opt using an operational amplifier. The optimal level VBL_opt generated by the reference voltage generator 133 is provided to the pre-charge/equalization circuit 122a during a pre-charge operation of the memory cell 112. As the pre-charge/equalization circuit 122a is activated, the bit line pair BL and BLB is pre-charged to the target voltage VBL_opt.

If the target voltage VBL_opt is provided by the reference voltage generator 133 to pre-charge the bit line pair BL and BLB, a pre-charge voltage adjusting operations such as pull-up, pull-down and shift operations performed on the bit line pair BL and BLB may be omitted. Thus, the bit line pair BL and BLB is pre-charged fast and a sensing speed is increased.

Figure 10:
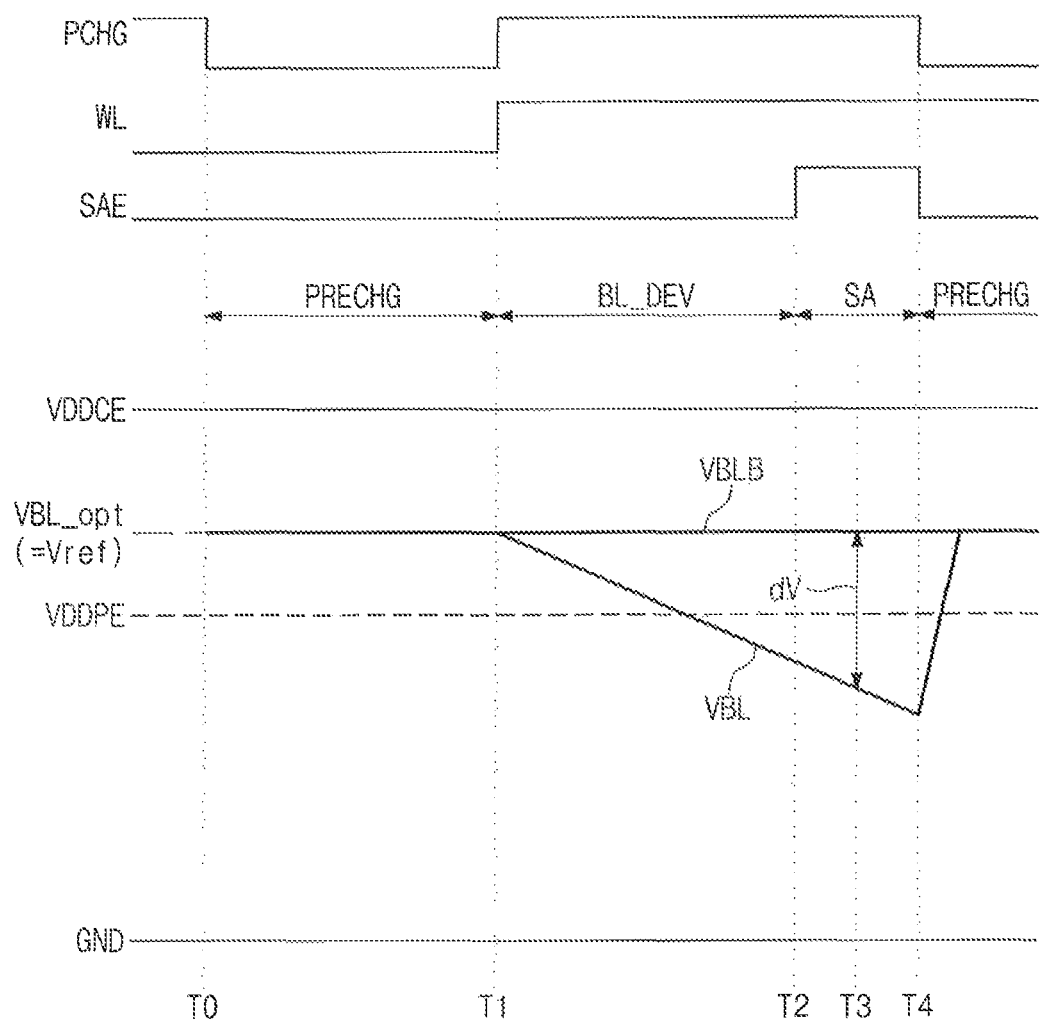
FIG. 10 is a voltage waveform diagram illustrating a bit line pre-charge operation of the SRAM device in FIG. 9.

FIG. 10 is a waveform diagram illustrating a bit line pre-charge operation performed in the SRAM device of FIG. 9, according to an exemplary embodiment of the inventive concept. Referring to FIG. 10, a bit line pair BL and BLB is pre-charged to the target voltage VBL_opt regardless of a first driving voltage VDDCE or a second driving voltage VDDPE.

At T0, a bit line pre-charge operation starts. If a pre-charge control signal PCHG transitions to a low level, PMOS transistors P3, P4 and P5 of a pre-charged/equalization circuit 122a are turned on. The target voltage VBL_opt provided from the reference voltage generator 133 is provided to the bit line pair BL and BLB. The bit line pair BL and BLB is pre-charged to the target voltage VBL_opt. Thus, an operation of adjusting the pre-charge voltage of the bit line pair BL and BLB is omitted.

At T1, a pre-charge control signal PCHG transitions to a high level and a word line WL (word line signal) transitions to a high level. The PMOS transistors P3 to P5 of the pre-charge/equalization circuit 122a are turned off and the optimal level VBL_opt provided from a reference voltage generator 133 is not provided to the bit line pair BL and BLB. At the same time, the path transistors PT1 and PT2 are turned on, connecting a selected memory cell 112 and the bit line pair BL and BLB. Data stored in the memory cell 112 is transferred to the bit line pair BL and BLB through the path transistors PT1 and PT2.

As described above, a voltage difference dV between the bit line pair BL and BLB is developed before the sense amplifier 124 is activated.

At T2, a sense amplifier enable signal SAE transitions to a high level. In this case, the sense amplifier 124 operates to read the data stored in the memory cell 121 based on the voltage difference dV between the bit lines BL and BLB.

At T4, the pre-charge control signal PCHG, the word line WL and the sensing enable signal SAE transition to a low level. At this time, the path transistors PT1 and PT2 are turned off and a pre-charging operation is performed on the bit line pair BL and BLB.

According to an exemplary embodiment, the target voltage VBL_opt is generated before a sensing operation starts, and the target voltage VBL_opt is provided to the bit line pair BL and BLB during the sensing operation of a memory cell. In this case, since an operation of pulling up or down voltages of the bit line pair BL and BLB is not required, a sensing speed is increased.

Figure 11:
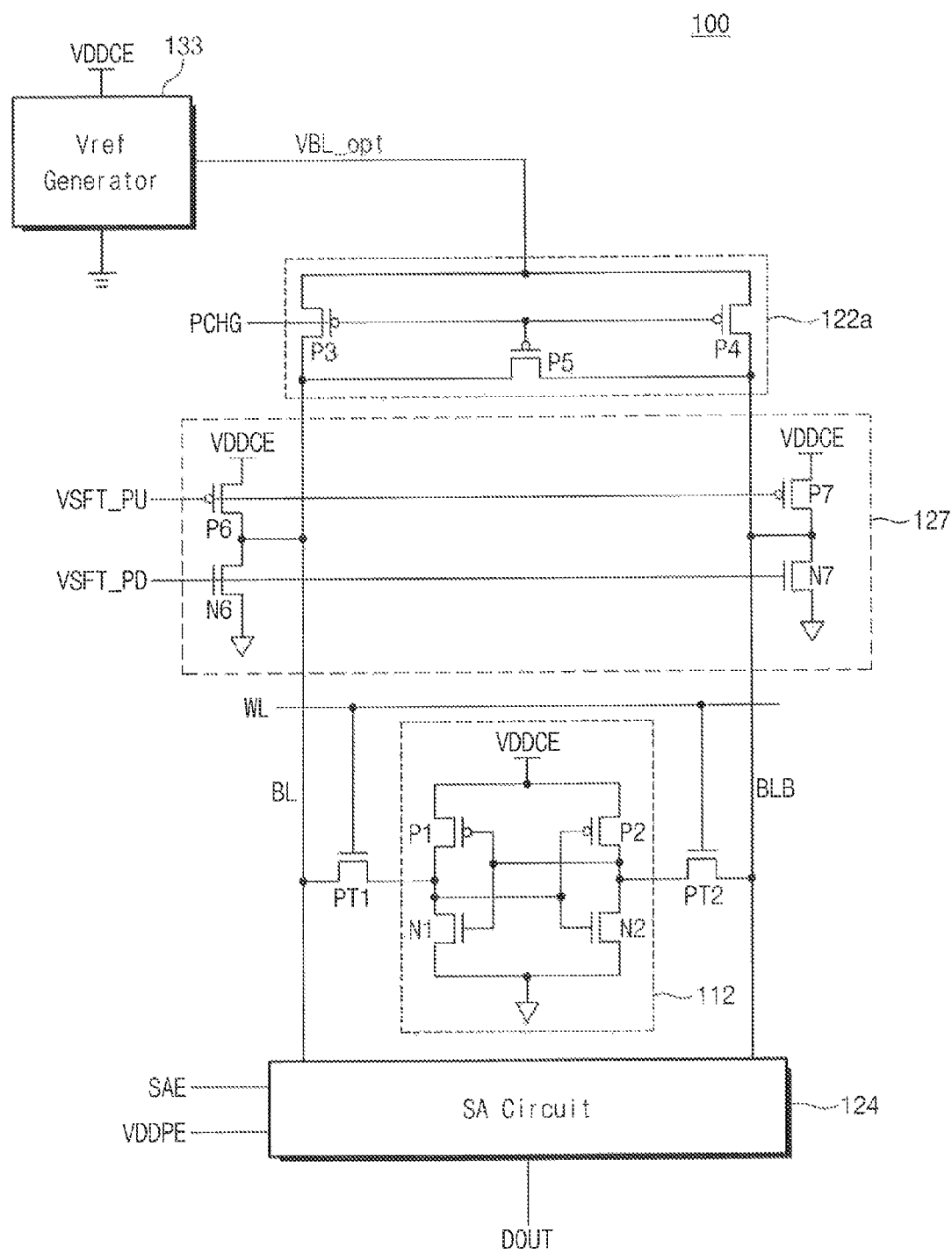
FIG. 11 is a circuit diagram illustrating an SRAM device according to an exemplary embodiment of the present inventive concept.

FIG. 11 is a circuit diagram illustrating an SRAM device according to an exemplary embodiment of the inventive concept. Referring to FIG. 11, the SRAM device 100 includes a reference voltage generator 133 and a gear shifting circuit 127 to provide the target voltage VBL_opt to a bit line pair BL and BLB. Here, a memory cell 112, a pre-charge/equalization circuit 122a and a sense amplifier 124 are substantially the same as those shown in FIG. 9, and the description thereof is thus omitted.

The reference voltage generator 133 generates the target voltage VBL_opt during a bit line pre-charge operation. The reference voltage generator 133 generates the target voltage VBL_opt using a first driving voltage VDDCE as a power supply voltage in a voltage drop manner. Alternatively, the reference voltage generator 133 may generate the target voltage VBL_opt using an operational amplifier. The optimal level VBL_opt generated by the reference voltage generator 133 is provided to the pre-charge/equalization circuit 122a during a pre-charge operation of the memory cell 112. As PMOS transistors P3, P4, and P5 of the pre-charge/equalization circuit 122a are activated, the bit line pair BL and BLB is pre-charged to the target voltage VBL_opt.

The gear shifting circuit 127 may compensate the driving capacity of the reference voltage generator 133. For example, if the reference voltage generator 133 has an insufficient driving capacity to pre-charge the bit line pair BL and BLB, the gear shifting circuit 127 may compensate such insufficiency of the reference voltage generator 133.

The gear shifting circuit 127 pulls up or down voltages of the bit line pair BL and BLB in response to a pull-up signal VSFT_PU and a pull-down signal VSFT_PD. The gear shifting circuit 127 includes PMOS transistors P6 and P7 connected to the first driving voltage VDDCE. The PMOS transistors P6 and P7 boost voltages of the bit line pair BL and BLB in response to the pull-up signal VSFT_PU. The gear shifting circuit 127 includes NMOS transistors N6 and N7 connected to a ground. The NMOS transistors N6 and N7 drop voltages of the bit line pair BL and BLB in response to the pull-down signal VSFT_PD.

A current path between the first driving voltage VDDCE and a ground is not formed at the gear shifting circuit 127 controlled by a pull-up or pull-down manner. According to an exemplary embodiment, a coarse pre-charging operation is performed on the bit line pair BL and BLB using the reference voltage generator 133, and then a fine pre-charging operation is performed on the bit line pair BL and BLB to the target voltage VBL_opt using the gear shifting circuit 127.

Figure 12:
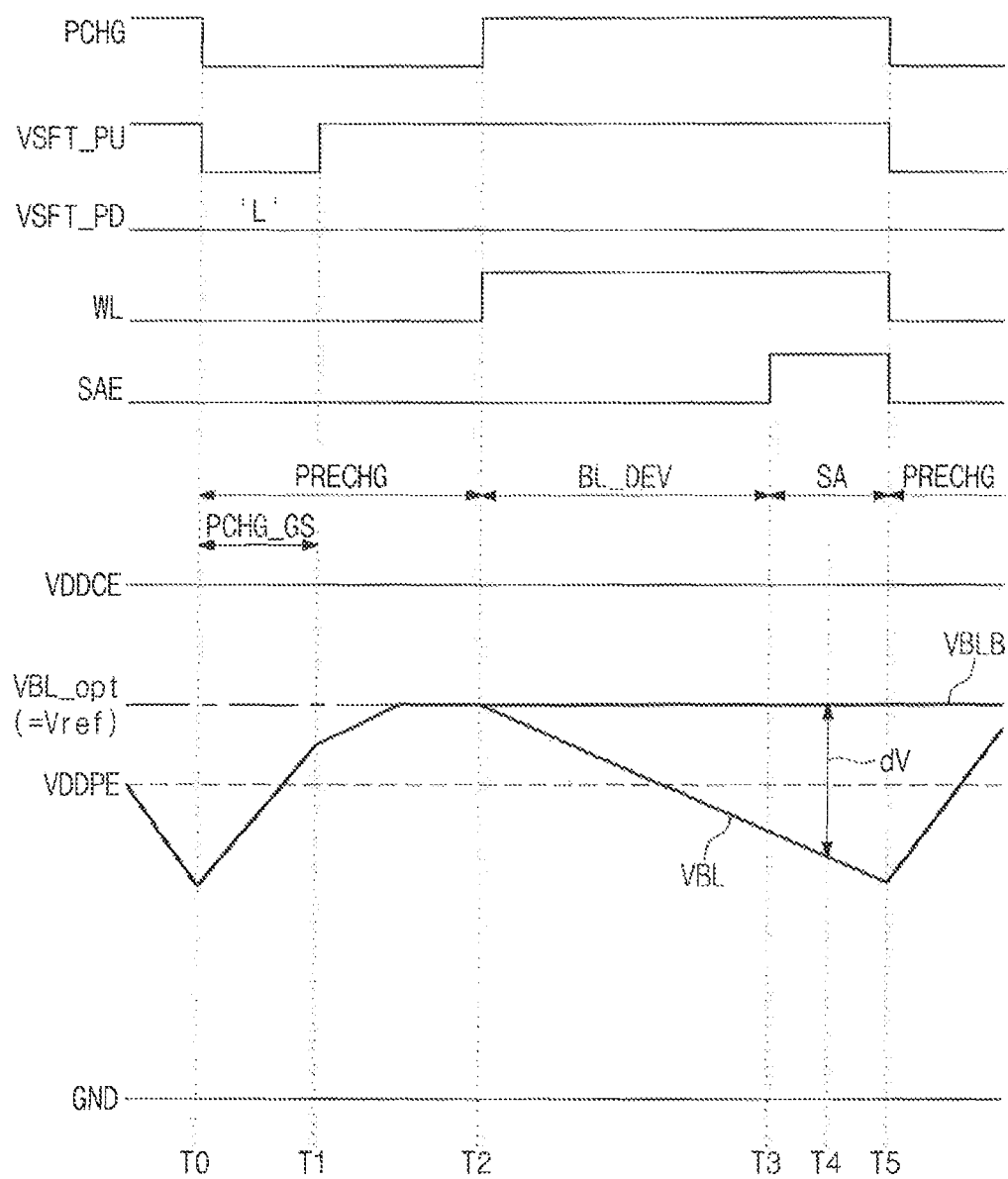
FIG. 12 is a voltage waveform diagram illustrating a bit line pre-charge operation of the SRAM device in FIG. 11.

FIG. 12 is a voltage waveform diagram illustrating a bit line pre-charge operation of the SRAM device of FIG. 11, according to an exemplary embodiment of the inventive concept. Referring to FIG. 12, the bit line pair BL and BLB is pre-charged to the target voltage VBL_opt through the gear shifting circuit 127 regardless of the output voltage of the reference voltage generator 133.

At T0, a bit line pre-charge operation starts when a pre-charge control signal PCHG transitions to a low level. PMOS transistors P3, P4, and P5 of the pre-charge/equalization circuit 122a are turned on. The bit line pair BL and BLB is pre-charged with the target voltage VBL_opt. The gear shifting circuit 127 may compensate the driving capability of the reference voltage generator 133. For example, if a pull-up signal VSFT_PU transitions to a low level at T0, the PMOS transistors P6 and P7 are turned on and the first driving voltage VDDCE is connected to the bit line pair BL and BLB.

In this case, the pre-charged voltage of the bit line pair BL and BLB is adjusted to the target voltage VBL_opt if the driving capacity of the reference voltage generator 133 is insufficient to pre-charge the bit line pair BL and BLB.

At T1, the pull-up signal VSFT_PU transitions to a high level, and the operation of the gear shifting circuit 127 ends. The reference voltage generator 133 drives the bit line pair BL and BLB to the optimal level VBL_opt without the gear shifting circuit 127. The bit line pair BL and BLB was previously pre-charged to a level approximating to the target voltage VBL_Opt during a gearing interval PCHG_GS. Thus, the reference voltage generator 133 may pre-charge the bit line pair BL and BLB to the target voltage VBL_opt using the driving capacity of the reference voltage generator 133.

At T2, the pre-charge control signal PCHG and a word line WL transition to a high level. The PMOS transistors P3, P4, and P5 of the pre-charge/equalization circuit 122a are turned off and the target voltage VBL_opt provided from the reference voltage generator 133 is not provided to the bit line pair BL and BLB. At the same time, the path transistors PT1 and PT2 are turned on to connect the memory cell 112 and the bit line pair BL and BLB. Data stored in the memory cell 112 is transferred to the bit line pair BL and BLB through the path transistors PT1 and PT2, and thus a voltage difference dV is developed between the bit line pair BL and BLB through such connections between the cell nodes A and B, and the bit line pair BL and BLB.

The voltage difference dV of the bit line pair BL and BLB may have different polarity depending on a logical value stored in the memory cell 112. For example, if the memory cell 112 stores a logic value "1", the voltage VBL of the bit line BL is lowered, while a voltage VBLB of the complementary bit line BLB changes little compared to the change in the bit line BL. If the memory cell 112 stores a logic value "0", the voltage VBLB of the complementary bit line BLB is lowered, while a voltage VB of the bit line BL changes little compared to the change in the complementary bit line BLB.

At T3, a sense amplifier enable signal SAE transitions to a high level. The sense amplifier 124 starts a sensing operation based on the voltage difference dV between the bit line pair BL and BLB.

At T5, the pre-charge control signal PCHG, the word line WL and the sensing enable signal SAE transition to a low level. At this time, the path transistors PT1 and PT2 are turned off and a pre-charging operation is performed on the bit line pair BL and BLB.

According to an exemplary embodiment, a pre-charge operation may be performed using the reference voltage generator 133 and the gear shifting circuit 127. In this case, the SRAM device 100 of FIG. 11 may have a high power characteristic.

Figure 13:
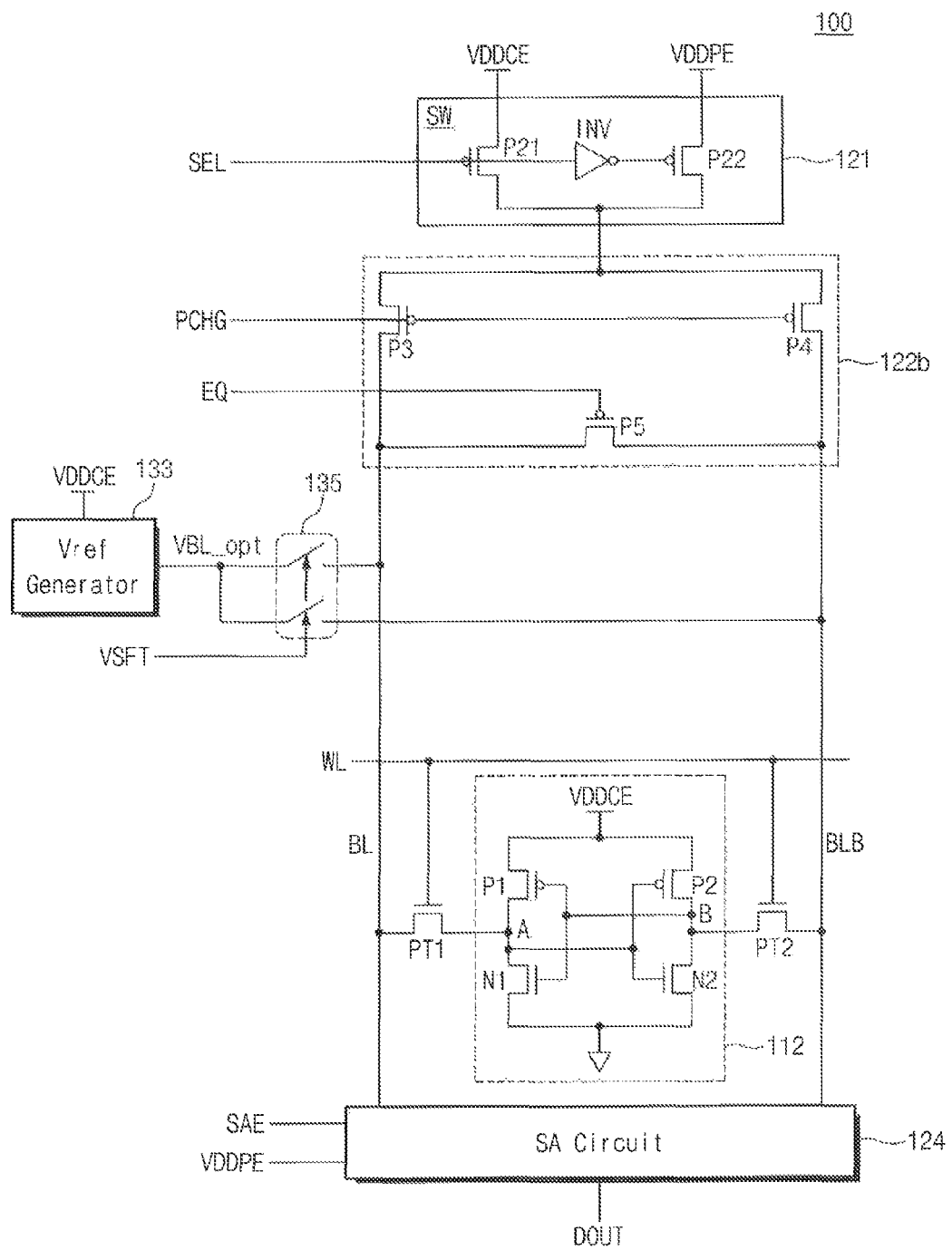
FIG. 13 is a circuit diagram illustrating an SRAM device according to an exemplary embodiment of the inventive concept.

FIG. 13 is a circuit diagram illustrating an SRAM device 100 according to an exemplary embodiment of the inventive concept. Referring to FIG. 13, the SRAM device 100 includes a memory cell 112, a sense amplifier 124, a pre-charge/equalization circuit 122b, a reference voltage generator 133, a power switch 121, and a shift switch 135. The power switch 121, the pre-charge/equalization circuit 122b, the memory cell 112 and the sense amplifier 124 are substantially the same as those of FIG. 6, and the description thereof is thus omitted.

The power switch 121 and the pre-charge/equalization circuit 122b pre-charge a bit line pair BL and BLB using a first driving voltage VDDCE or a second driving voltage VDDPE. In addition, the reference voltage generator 133 and the shift switch 135 adjust the pre-charge voltage of the bit line pair BL and BLB to a target voltage VBL_opt that is different from the first driving voltage VDDCE or the second driving voltage VDDPE. The reference voltage generator 133, for example, generates the target voltage VBL_opt. The shift switch 135 adjusts pre-charge voltages of the bit line pair BL and BLB to the target voltage VBL_opt that is generated from the reference voltage generator 133. For example, the shift switch 135 adjusts the pre-charged voltage of the bit line pair BL and BLB in response to a shift control signal VSFT provided from control logic 130.

Figure 14:
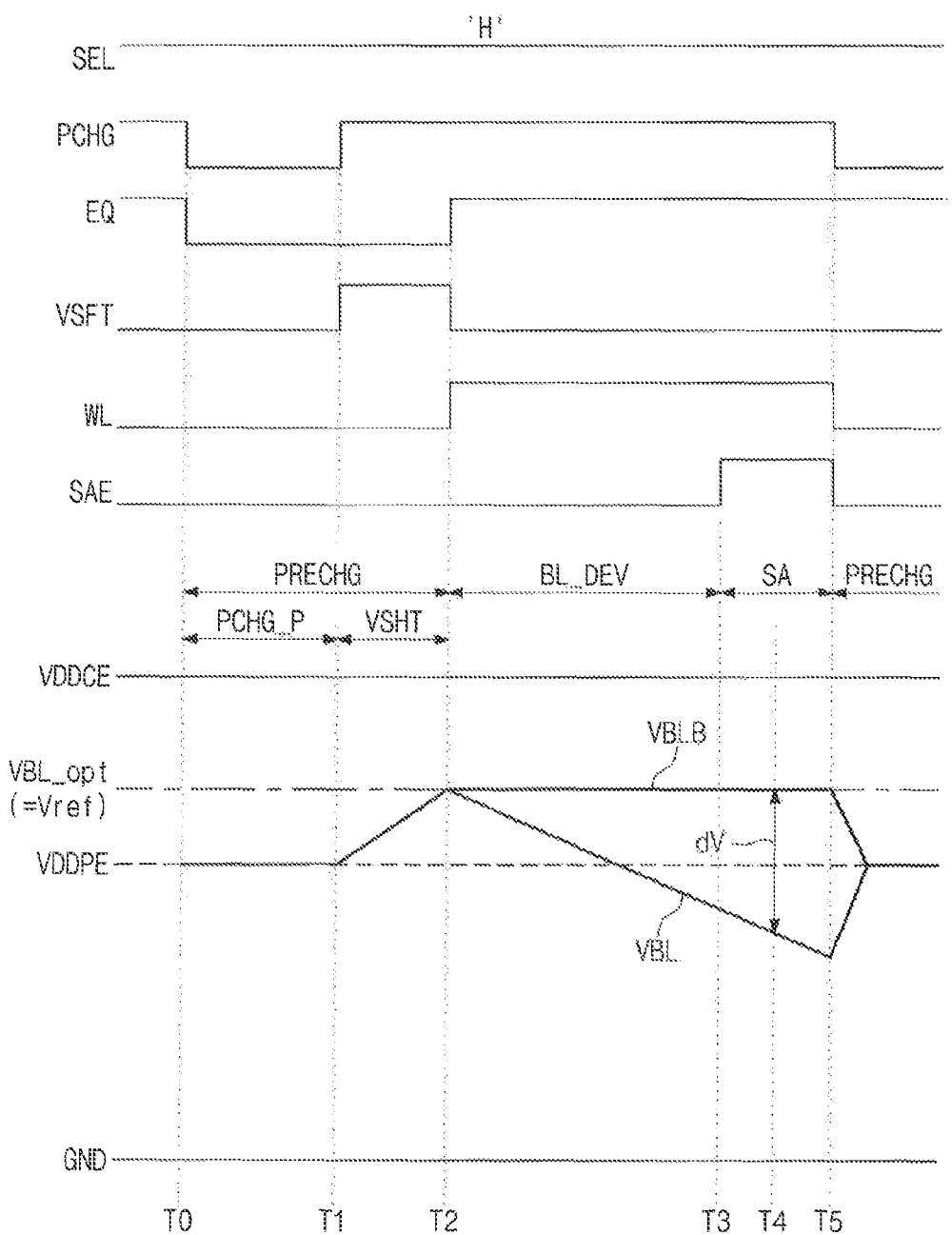
FIG. 14 is a waveform diagram illustrating a sensing operation of the SRAM device in FIG. 13.

FIG. 14 is a waveform diagram illustrating a sensing operation of the SRAM device of FIG. 13, according to an exemplary embodiment of the inventive concept. Referring to FIG. 14, in a pre-charging operation, the bit line pair BL and BLB is first pre-charged to the second driving voltage VDDPE and then the pre-charged voltage is adjusted to the target voltage of the reference voltage generator 133.

At T0, a bit line pre-charge operation using the power switch 121 and the pre-charge/equalization circuit 122b starts. A pre-charge control signal PCHG and an equalization signal EQ transition to a low level, and the second driving voltage VDDPE is provided to the bit line pair BL and BLB. The bit line pair BL and BLB is pre-charged to the second driving voltage VDDPE through the pre-charge/equalization circuit 122b. The second driving voltage VDDPE is lower than the target voltage VBL_opt.

At T1, the pre-charged voltage of the bit line pair BL and BLB is adjusted to the target voltage VBL_ppt. The pre-charge control signal PCHG transitions to a high level. The equalization signal EQ maintains a low level. The shift control signal VSFT transitions to a high level, and the pre-charged voltage is increased to the target voltage VBL_opt.

For example, the shift switch 135 transfers the target voltage VBL_opt output generated from the reference voltage generator 133 to the bit line pair BL and BLB in response to the shift control signal VSFT. Accordingly, the bit line pair BL and BLB is pre-charged to the target voltage VBL_opt through the pre-charge/equalization circuit 122b.

At T2, the shift control signal VSFT transitions to a low level. For a read operation, a word line WL transitions to a high level. If the path transistors PT1 and PT2 are turned on, a voltage difference dV is developed between the bit line pair BL and BLB.

At T3, a sense amplifier enable signal SAE transitions to a high level such that a sense amplifier 124 is activated. Thus, a sensing operation starts. The bit line pair BL and BLB is developed to have a voltage difference dV at time T4 when the sensing operation is performed. The bit line pair BL and BLB is pre-charged to the target voltage VBL_opt, and the voltage difference dV is developed based on the pre-charged voltage at time T4. Alternatively, the voltage difference dV may be secured at time T3 when the sense amplifier enable signal SAE transitions a high level.

At T5, the pre-charge control signal PCHG, the word line WL and the sensing enable signal SAE transition to the low level. At this time, the path transistors PT1 and PT2 are turned off and a pre-charging operation is performed on the bit line pair BL and BLB.

According to an exemplary embodiment, the bit line pair BL and BLB is first precharged using VDDPE and then such pre-charged voltage of the bit line pair BL and BLB is adjusted to the target voltage VBL_opt using the reference voltage generator 133. Such pre-charged voltage adjustment scheme may secure the voltage difference dV between the bit line pair BL and BLB for a sensing operation in the sense amplifier 124.

Figure 15:
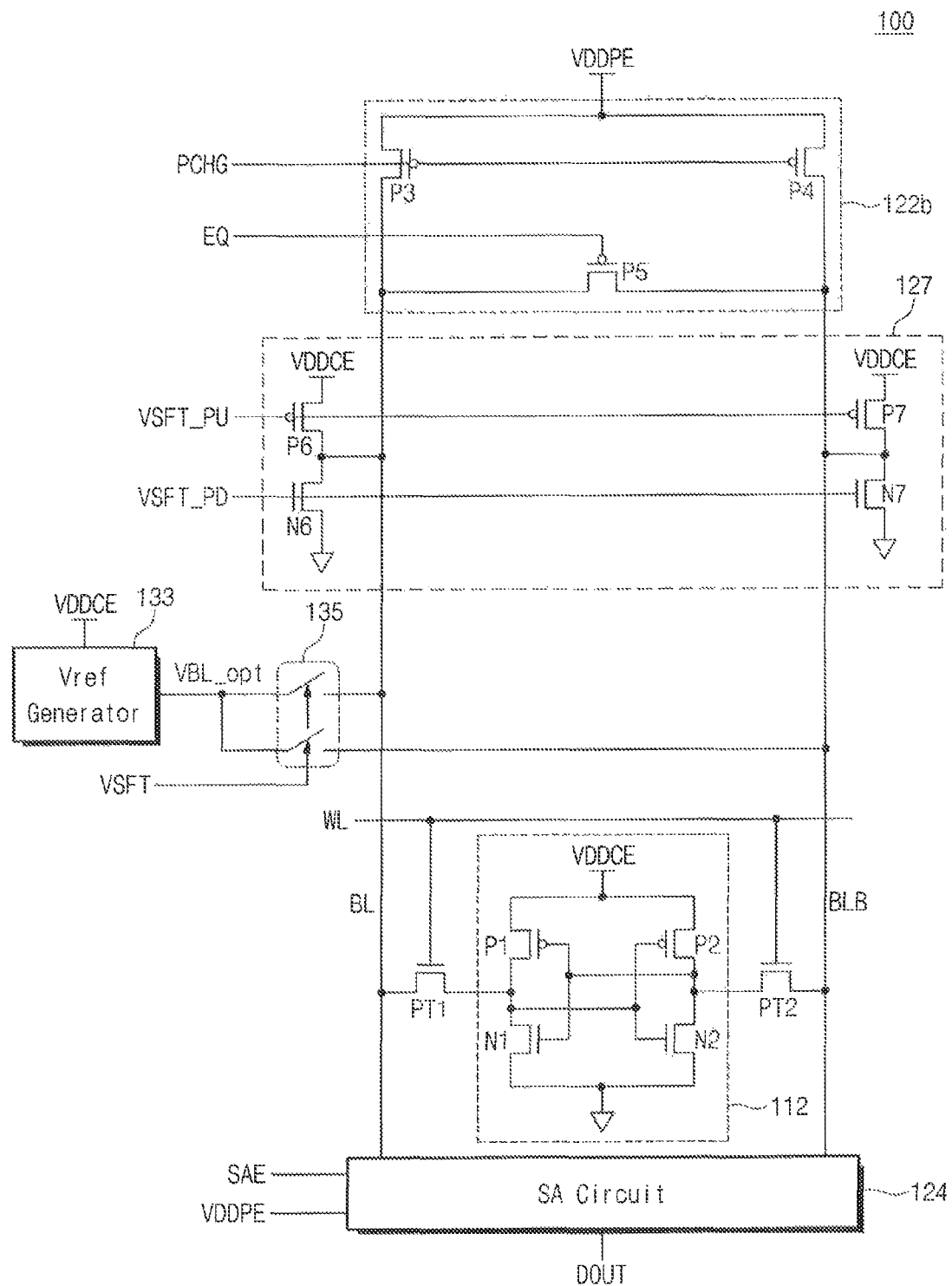
FIG. 15 is a circuit diagram illustrating an SRAM device according to an exemplary embodiment of the present inventive concept.

FIG. 15 is a circuit diagram schematically illustrating an SRAM device 100 according to an exemplary embodiment of the inventive concept. Referring to FIG. 15, an SRAM device 100 includes a memory cell 112, a sense amplifier 124, a pre-charge/equalization circuit 122b, a gear shifting circuit 127, a reference voltage generator 133, and a shift switch 135. The pre-charge/equalization circuit 122b, the memory cell 112 and the sense amplifier 124 are substantially the same as those shown in FIG. 11, and the description thereof is thus omitted.

The pre-charge/equalization circuit 122b pre-charges a bit line pair BL and BLB using a second driving voltage VDDPE before a sensing operation. In addition, the reference voltage generator 133 and the shift switch 135 adjust the pre-charge voltage of the bit line pair BL and BLB, for example, the second driving voltage VDDPE to the target voltage VBL_opt. The reference voltage generator 133 and the shift switch 135 operate substantially the same as described with reference to FIG. 13, and the description thereof is thus omitted.

The gear shifting circuit 127 and the reference voltage generator 133 serve to adjust the pre-charged voltage of the second driving voltage VDDPE to the reference voltage VBL_opt. When the driving capacity of the reference voltage generator 133 is insufficient to pre-charge the bit line pair BL and BLB, the gear shifting circuit 127 may serve to compensate such insufficiency in the driving capacity of the reference voltage generator 133.

The gear shifting circuit 127 pulls up or down the pre-charged voltage of the bit line pair BL and BLB in response to pull-up and pull-down signals VSFT_PU and VSFT_PD during a pre-charge operation. The gear shifting circuit 127 includes PMOS transistors P6 and P7 connected to the first driving voltage VDDPE. The PMOS transistors P6 and P7 boosts voltages of the bit line pair BL and BLB in response to the pull-up signal VSFT_PU. The gear shifting circuit 127 further includes NMOS transistors N6 and N7 connected to a ground. The NMOS transistors N6 and N7 drop the pre-charged voltage of the bit line pair LB and BLB in response to the pull-down signal VSFT_PD.

Using the compensation of the gear shifting circuit 127, a pre-charge operation speed of the bit line pair BL and BLB is increased.

Figure 16:
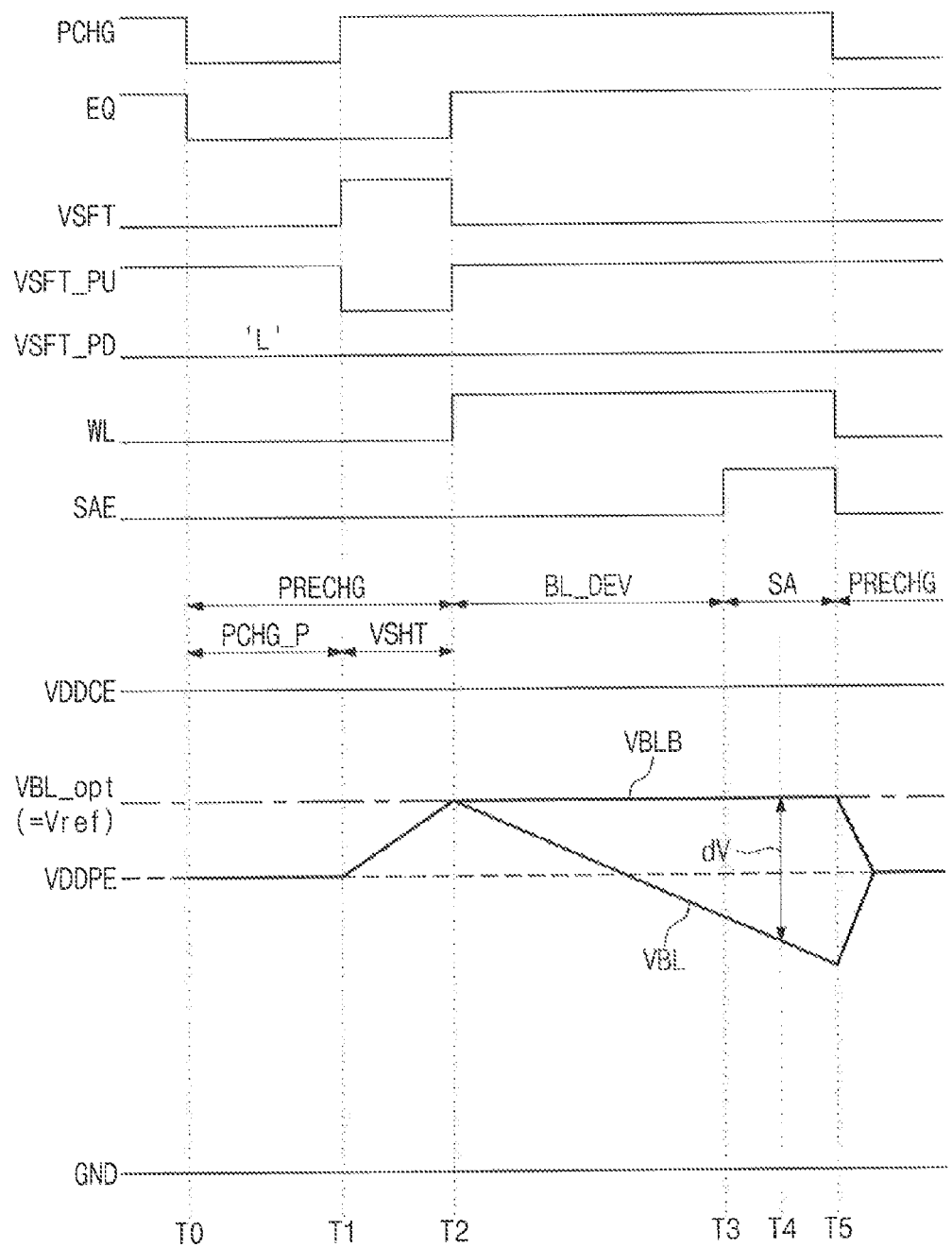
FIG. 16 is a waveform diagram illustrating a sensing operation of the SRAM device in FIG. 15.

FIG. 16 is a waveform diagram schematically illustrating a sensing operation of an SRAM device shown in FIG. 15. Referring to FIG. 16, the bit line pair BL and BLB is first pre-charged to the second driving voltage VDDPE, and then the pre-charged voltage of the bit line pair BL and BLB is adjusted to the target voltage VBL_opt using the reference voltage generator 133 and the gear shifting circuit 127.

At T0, a bit line pre-charge operation of the pre-charge/equalization circuit 122b starts. First, a pre-charge control signal PCHG and an equalization signal EQ transition to a low level to pre-charge the bit line pair BL and BLB to the second voltage VDDPE. The bit line pair BL and BLB is pre-charged to the second driving voltage VDDPE through the pre-charge/equalization circuit 122b. However, the second driving voltage VDDPE is lower than the target voltage VBL_opt.

At T1, the pre-charged voltage of the bit line pair BL and BLB is adjusted from the second driving voltage VDDPE to the target voltage VBL_opt. The pre-charge control signal PCHG transitions to a high level, and thus the pre-charge operation using the second driving voltage VDDPE ends. However, the equalization signal EQ maintains a low level. If the shift control signal VSFT transitions to a high level and a pull-up signal VSFT_PU transitions to a low level, the pre-charge voltage of the second driving voltage VDDPE is adjusted to the target voltage VBL_opt.

At T2, the shift control signal VSFT transitions to a low level. As a word line WL transitions to a high level for a read operation, the path transistors PT1 and PT2 are turned on. Thus, a voltage difference dV is developed between the bit line pair BL and BLB.

At T3, a sense amplifier enable signal SAE transitions to a high level such that the sense amplifier 124 is activated. The sense amplifier 124 detects the voltage difference dV between the bit line pair BL and BLB. The bit line pair BL and BLB that is pre-charged to the target voltage VBL_opt is developed to have the voltage difference dV at time T4 when a sensing operation is performed in response to the sense amplifier enable signal SAE. Alternatively, the voltage difference dV may be secured at time T3 when the sense amplifier enable signal SAE transitions a high level.

At T5, the pre-charge control signal PCHG, the word line WL and the sensing enable signal SAE transition to a low level. At this time, the path transistors PT1 and PT2 are turned off and a pre-charging operation is performed on the bit line pair BL and BLB.

According to an exemplary embodiment, the bit line pair BL and BLB is first precharged using VDDPE and then such pre-charged voltage of the bit line pair BL and BLB is adjusted to the optimal level VBL_Opt generated from the reference voltage generator 133. The driving capacity of the reference voltage generator 133 is compensated using the gear shifting circuit 127. For example, the target voltage VBL_opt is formed using both the reference voltage generator 133 and the gear shifting circuit 127. Such pre-charged voltage adjustment scheme may secure the voltage difference dV between the bit line pair BL and BLB for a sensing operation in the sense amplifier 124.

Figure 17:
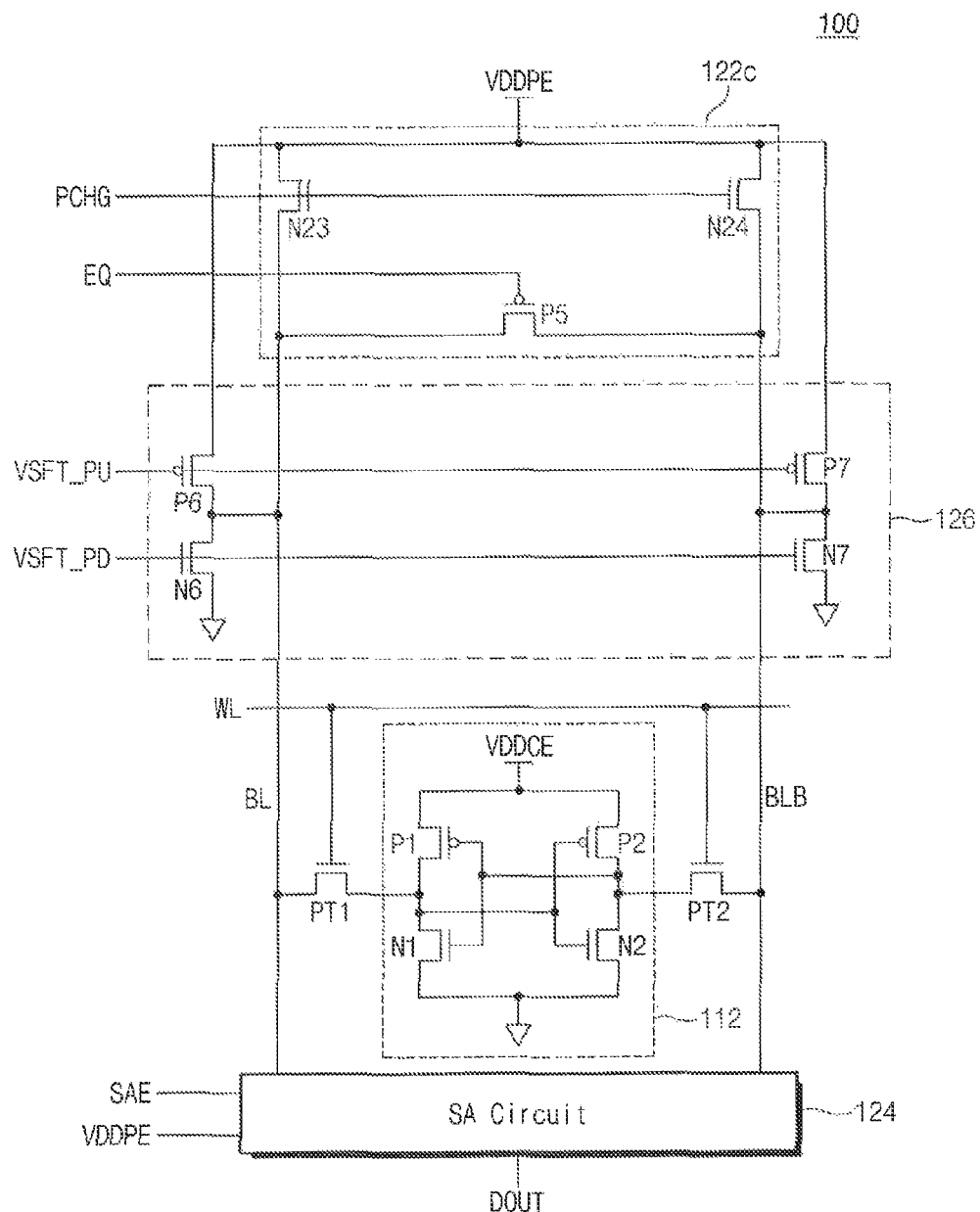
FIG. 17 is a circuit diagram illustrating an SRAM device according to an exemplary embodiment of the present inventive concept.

FIG. 17 is a circuit diagram schematically illustrating an SRAM device 100 according to an eighth embodiment of the inventive concepts. Referring to FIG. 17, the SRAM device 100 includes a pre-charge/equalization circuit 122c and a pull-up/pull-down circuit 126 that control a pre-charge voltage of a bit line pair BL and BLB during a pre-charge operation. Here, the memory cell 112, the pull-up/pull-down circuit 126 and the sense amplifier 124 are substantially the same as those shown in FIG. 11, and the description thereof is thus omitted.

The pre-charge/equalization circuit 122c includes NMOS transistors N23 and N24 for providing a first driving voltage VDDCE to the bit line pair BL and BLB. The pre-charge/equalization circuit 122c further includes a PMOS transistor P5 for equalizing the bit line pair BL and BLB. A pre-charge control signal PCHG is provided to gates of the NMOS transistors N23 and N24. If the pre-charge control signal PCHG transitions to a high level, the NMOS transistors N23 and N24 are turned on. The NMOS transistors N23 and N24 provides a voltage less than a second driving voltage VDDPE due to a voltage drop in the NMOS transistors N23 and N24. Such voltage drop is caused by the threshold voltage Vth drop in the NMOS transistors N23 and N24. The PMOS transistor P5 equalizes the bit line pair BL and BLB in response to an equalization signal EQ.

The bit line pair BL and BLB pre-charged to a coarse pre-charge voltage (VDDPE-Vth) by the NMOS transistors N23 and N24, and then such pre-charged voltage is adjusted to the target voltage VBL_opt using the pull-up/pull-down circuit 126. The pre-charged voltage of the bit line pair BL and BLB is adjusted to the target voltage VBL_opt in response to a pull-up signal VSFT_PU and a pull-down signal VSFT_PD.

With the above description, the NMOS transistors N23 and N24 provide the coarse pre-charge voltage (VDDPE-Vth) without a current path between a power supply voltage and a ground.

Figure 18:
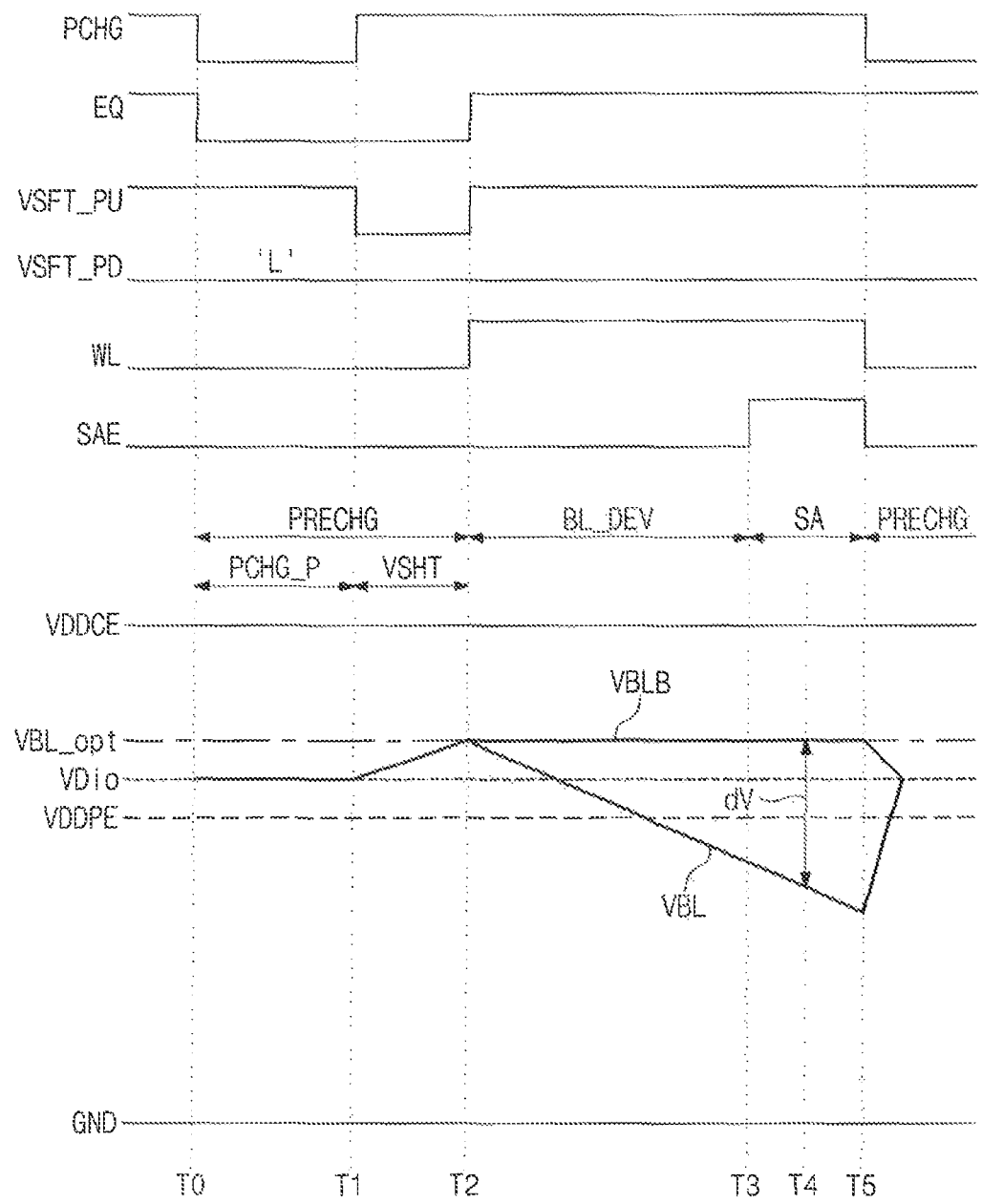
FIG. 18 is a voltage waveform diagram illustrating a bit line pre-charge operation of the SRAM device in FIG. 17.

FIG. 18 is a voltage waveform diagram schematically illustrating a bit line pre-charge operation of an SRAM device shown in FIG. 17. Referring to FIG. 18, the bit line pair BL and BLB is pre-charged to a coarse pre-charge voltage (VDDPE-Vth) using NMOS transistors N23 and N24, and the pre-charged voltage of the bit line pair BL and BLB is adjusted to the target voltage VBL_opt.

At T0, as a pre-charge control signal PCHG transitions to a high level, the NMOS transistors N23 and N24 of a pre-charge/equalization circuit 122c are turned on. The bit line pair BL and BLB is pre-charged to a coarse pre-charge voltage VDio (VDDPE-Vth). The coarse pre-charge voltage VDio is determined as VDDPE-Vth, where the Vth is a threshold voltage of the NMOS transistors N23 and N24.

At T1, the pre-charge control signal PCHG transitions to a high level, and a pull-up signal VSFT_PU transitions to a low level. During the duration of the pull-up signal VSFT_PU as the low level, the pre-charged voltage of the bit line pair BL and BLB is adjusted from the coarse pre-charge voltage VDio to the target voltage VBL_opt.

At T2, an equalization signal EQ and a pull-up control signal VSFT_UP transition to a high level, and a word line WL transitions to a high level for a read operation. As the path transistors PT1 and PT2 are turned on, the pre-charged voltage of the bit line pair BL and BLB starts develop into a voltage difference dV.

At T3, a sense amplifier enable signal SAE transitions to a high level and thus the sense amplifier 124 is activated to start a sensing operation. The sense amplifier 124 detects the voltage difference dV between the bit line pair BL and BLB. The pre-charged voltage of the bit line pair BL and BLB is developed to have the voltage difference dV at time T4 when a sensing operation is performed. Alternatively, the voltage difference dV may be secured at time T3 when the sense amplifier enable signal SAE transitions a high level.

At T5, the pre-charge control signal PCHG, the word line WL and the sensing enable signal SAE transition to a low level. At this time, the path transistors PT1 and PT2 are turned off and another pre-charging operation is performed on the bit line pair BL and BLB.

According to an exemplary embodiment, the bit line pair BL and BLB is first pre-charged to the coarse pre-charge voltage VDio and then such coarse pre-charge voltage is adjusted to the target voltage VBL_opt using the pull-up/pull-down circuit 126.

Figure 19:
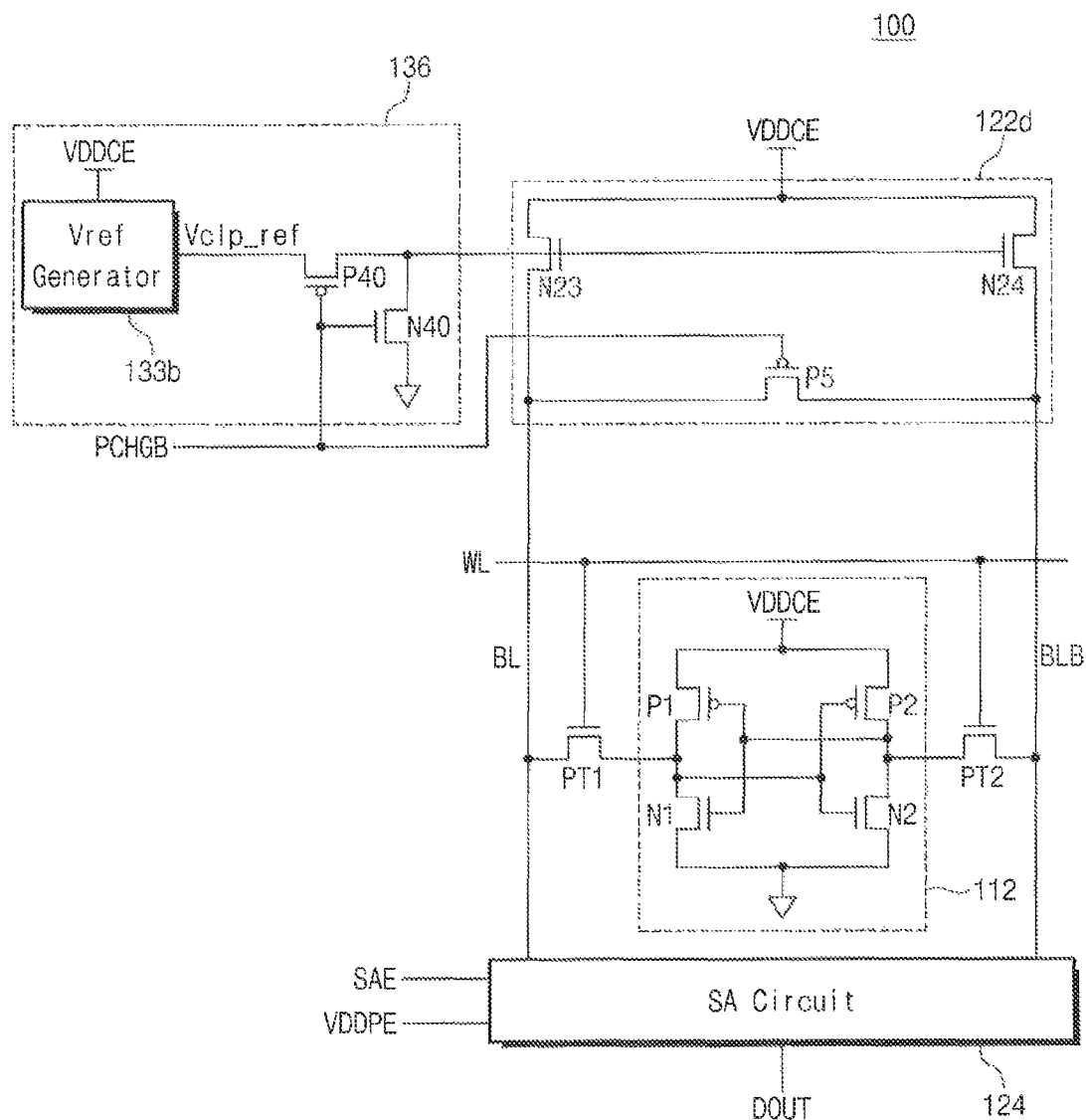
FIG. 19 is a circuit diagram illustrating the SRAM device according to an exemplary embodiment of the present inventive concept.

FIG. 19 is a circuit diagram schematically illustrating an SRAM device 100 according to an exemplary embodiment of the inventive concept. Referring to FIG. 19, an SRAM device 100 includes a pre-charge/equalization circuit 122d and a clamp control unit 136 that control a pre-charge voltage of a bit line pair BL and BLB during a pre-charge operation. Here, a memory cell 112 and a sense amplifier 124 are substantially the same as those shown in FIG. 17, and the description thereof is thus omitted.

The pre-charge/equalization circuit 122d is substantially similar to the pre-charge/equalization circuit 122c of FIG. 17, except that a clamp voltage Vclp_ref provided from the clamp control unit 136 is applied to gates of NMOS transistors N23 and N24. The clamp voltage Vclp_ref is provided to the gates of the NMOS transistors N23 and N24 using a pre-charge control signal PCHGB. For example, during a low-level interval of the pre-charge control signal PCHGB, a PMOS transistor P40 is turned on, while an NMOS transistor N40 is turned off. At this time, the clamp voltage Vclp_ref is provided to the gates of the NMOS transistors N23 and N24.

The pre-charge/equalization circuit 122d includes the NMOS transistors N23 and N24 that provide a first driving voltage VDDCE to the bit line pair BL and BLB. The pre-charge/equalization circuit 122d further includes a PMOS transistor P5 that equalizes the bit line pair BL and BLB. During a low-level interval of the pre-charge control signal PCHGB, the clamp voltage Vclp_ref is provided to the gates of the NMOS transistors N23 and N24. In this case, the NMOS transistors N23 and N24 are turned on, so that an operation of pre-charging the bit line pair BL and BLB with the first driving voltage VDDCE starts. But, if the pre-charged voltage of the bit line pair BL and BLB increases to a shut-off level (Vclp_ref-Vth), the NMOS transistors N23 and N24 are turned off. Here, 'Vth' indicates a threshold voltage of each of the NMOS transistors N23 and N24. For example, if a gate-source voltage Vgs of each of the NMOS transistors N23 and N24 is lower than the threshold voltage Vth, the pre-charge operation using the NMOS transistors N23 and N24 is stopped. Thus, the bit line pair BL and BLB may be pre-charged to a shut-off level (Vclp_ref-Vth). A reference voltage generator 133b is controlled such that the shut-off level (Vclp_ref-Vth) is equal to the target voltage necessary for a secure sensing operation.

In this case, the bit line pair BL and BLB is pre-charged to the target voltage VBL_opt using the clamp control unit 136. Thus, a level adjusting operation (e.g., a pull-up or pull-down operation on the bit line pair BL and BLB) is not required.

In addition, the bit line pair BL and BLB is pre-charged to the target voltage VBL_opt without using a second driving voltage VDDPE. Thus, power routing is simplified, compared to a dual power routing.

Figure 20:
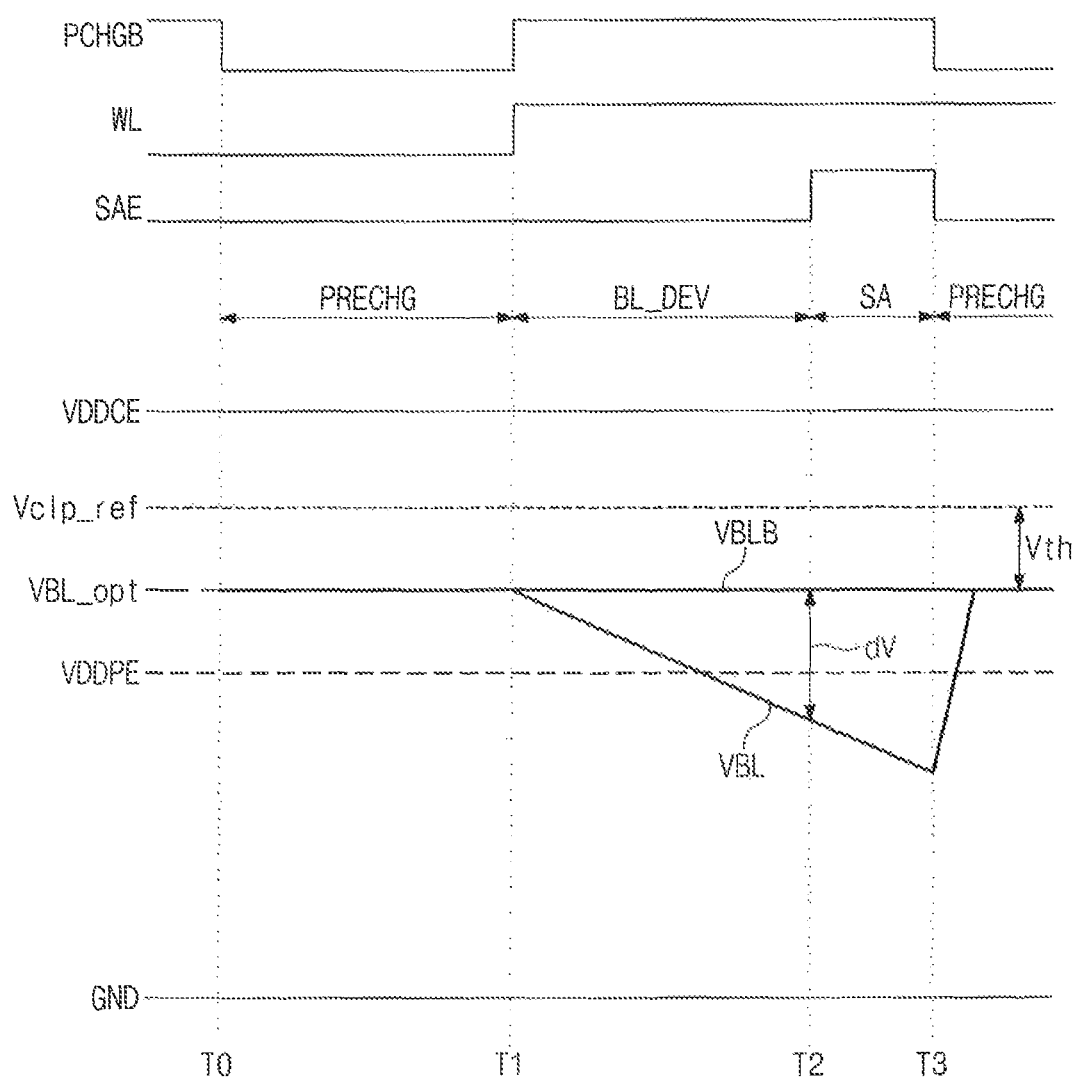
FIG. 20 is a voltage waveform diagram illustrating a bit line pre-charge operation of the SRAM device in FIG. 19.

FIG. 20 is a voltage waveform diagram illustrating a bit line pre-charge operation of an SRAM device shown in FIG. 19. Referring to FIG. 20, the bit line pair BL and BLB is pre-charged to the target voltage VBL_opt from an active time point of a pre-charge/equalization circuit 122d.

At T0, a pre-charge control signal PCHGB transitions to a low level, and the clamp voltage Vclp_ref is applied to NMOS transistors N23 and N24 of the pre-charge/equalization circuit 122d. At this time, the bit line pair BL and BLB is pre-charged to the target voltage VBL_opt (=Vclp_ref-Vth).

At T1, the pre-charge control signal PCHGB transitions to a high level. A word line WL transitions to a high level for a read operation, and the path transistors PT1 and PT2 are turned on. Thus, a bit line develop operation starts.

At T2, a sense amplifier enable signal SAE transitions to a high level such that the sense amplifier 124 is activated. Thus, a sensing operation starts. The sense amplifier 124 detects a voltage difference dV between the bit line pair BL and BLB. The pre-charged voltage of the bit line pair BL and BLB is developed to have the voltage difference dV at a time when a sensing operation is performed.

At T3, the pre-charge control signal PCHG transitions to a low level, and the word line WL and the sensing enable signal SAE transitions to a low level. At this time, the path transistors PT1 and PT2 are turned off and another pre-charging operation is performed on the bit line pair BL and BLB.

Since a power line for a driving voltage VDDCE only is routed, routing of the driving voltage VDDCE is simplified, compared to a dual power routing. In addition, since an operation of pulling up or down voltages of the bit line pair BL and BLB is not required, a sensing operation is performed fast.

Figure 21:
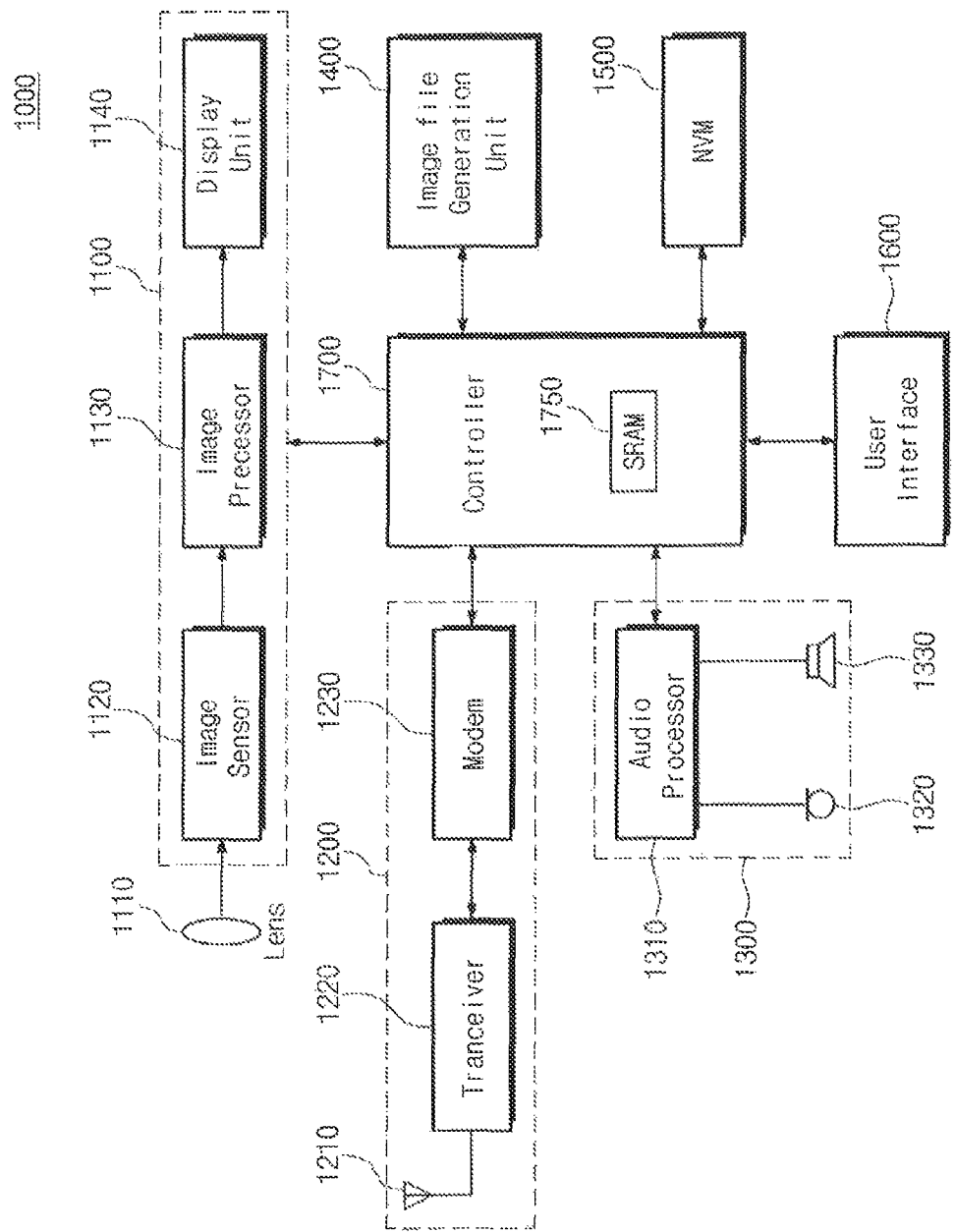
FIG. 21 is a block diagram illustrating a portable terminal according to an exemplary embodiment of the present inventive concept.

FIG. 21 is a block diagram illustrating a portable terminal according to an exemplary embodiment of the inventive concept. Referring to FIG. 21, a portable terminal 1000 includes an image processing unit 1100, a wireless transceiver unit 1200, an audio processing unit 1300, an image file generating unit 1400, a non-volatile memory 1500, a user interface 1600, and a controller 1700.

The image processing unit 1100 includes a lens 1110, an image sensor 1120, an image processor 1130, and a display unit 1140. The wireless transceiver unit 1200 includes an antenna 1210, a transceiver 1220, and a modem 1230. The audio processing unit 1300 includes an audio processor 1310, a microphone 1320, and a speaker 1330.

The portable terminal may include various semiconductor devices. For example, the controller 1700 may include a low-power and high-performance application processor. The controller 1700 may include a multi-core processor. The controller 1700 further includes an SRAM device 1750 where a pre-charge technique of the inventive concept is applied. The SRAM device 1750 is driven in a dual power manner. The SRAM device 1750 may be reliable in performing a read operation using a pre-charge operation according to an exemplary embodiment.

A system on chip according to an exemplary embodiment of the inventive concept may be packaged using various packages including PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), or Wafer-Level Processed Stack Package (WSP).

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A static random access memory (SRAM) device, comprising: a memory cell supplied with a first driving voltage and configured to store data; a bit line pair connected to the memory cell; a sense amplifier connected to the bit line pair and supplied with a second driving voltage that is lower than the first driving voltage; and a control logic configured to select a pre-charge voltage from the first and second driving voltages, pre-charge the bit line pair to the pre-charge voltage and adjust the pre-charged voltage to a target voltage.

2. The SRAM device of claim 1, wherein if the second driving voltage is higher than a predetermined voltage, the control logic is configured to select the second voltage as the pre-charge voltage, and if the second driving voltage is lower than the predetermined voltage, the control logic is configured to select the first voltage as the pre-charge voltage.

3. The SRAM device of claim 2, wherein the predetermined voltage corresponds to a minimum pre-charge voltage below which the sense amplifier fails to detect the data stored in the memory cell.

4. The SRAM device of claim 1, wherein if a driving voltage difference of the first and second driving voltages is smaller than a predetermined voltage difference, the control logic is configured to select the second voltage as the pre charge voltage, and if the driving voltage difference is greater than the predetermined voltage difference, the control logic is configured to select the first voltage as the pre-charge voltage.

5. The SRAM device of claim 4, wherein the predetermined voltage difference is about 250 mV.

6. The SRAM device of claim 1, further comprising: a power switch configured to select the pre-charge voltage according to control of the control logic; and a pre-charge/equalization circuit configured to pre-charge the bit line pair to the pre charge voltage according to control of the control logic.

7. The SRAM device of claim 4, wherein the control logic comprises a level detector configured to detect the driving voltage difference and to generate a selection signal based on the detection result, and further comprising; a power switch configured to select the pre-charge voltage according to the selection signal; and a pre-charge/equalization circuit configured to pre-charge the bit line pair to the pre charge voltage according to control of the control logic.

8. The SRAM device of claim 1, further comprising: a pre-charge voltage adjustment circuit configured to adjust the pre-charge voltage to the target voltage according to control of the control logic.

9. The SRAM device of claim 8, wherein the pre-charge voltage adjustment circuit comprises: a pull-up/pull-down circuit configured to pull up or down the pre-charge voltage using one of the first driving voltage and a ground in response to the control of the control logic including pull-up and pull-down control signals.

10. The SRAM device of claim 8, wherein the pre-charge voltage adjustment circuit comprises: a reference voltage generator configured to generate the target voltage, wherein the control logic is configured to control the reference voltage generator such that the pre-charge voltage of the bit line pair is adjusted to the target voltage using the target voltage of the reference voltage generator.

11. The SRAM device of claim 8, wherein the pre-charge voltage adjustment circuit comprises: a shift circuit configured to adjust the pre-charge voltage to the target voltage using the first driving voltage, wherein the control logic is configured to control the shift circuit such that the pre-charge voltage is adjusted to the target voltage.

12. The SRAM device of claim 8, wherein the pre-charge voltage adjustment circuit comprises: a pull-up/pull-down circuit configured to pull up or down the pre-charge voltage using one of the first driving voltage and a ground in response to pull-up and pull-down control signals of the control logic; and a reference voltage generator configured to generate the target voltage applied to the bit line pair in response to control of the control logic, wherein the pull-up/pull-down circuit and the reference voltage generator co-operatively adjust the pre-charge voltage of the bit line pair to the target voltage.

13. The SRAM device of claim 1, wherein the control logic is configured to select the pre-charge voltage based on an operation mode of the SRAM device.

14. The SRAM device of claim 12, wherein if the operation mode of the SRAM device is in a high-speed operation mode, the second voltage is selected as the pre-charge voltage, and if the operation mode of the SRAM device is in a low-speed operation mode, the control logic is configured to select the first voltage as the pre-charge voltage.

15. A method of performing a bit line pre-charge operation in a static random access (SRAM) device, comprising: providing a first driving voltage to a memory cell; providing a second driving voltage to a sense amplifier, wherein the second driving voltage is lower than the first driving voltage; selecting one of the first and second driving voltages as a pre-charge voltage; providing the pre-charge voltage to a bit line pair electrically connected to the memory cell; and adjusting the pre-charge voltage to a target voltage before starting a sensing operation.

16. The bit line pre-charge method of claim 15, wherein the selecting of the pre-charge voltage comprises: detecting an operation mode of the SRAM device; if the detection result corresponds to a high-speed operation mode, selecting the second driving voltage as the pre-charge voltage; and if the detection result corresponds to a low-speed operation mode, selecting the first driving voltage as the pre-charge voltage.

17. The bit line pre-charge method of claim 15, wherein the selecting of the pre-charge voltage comprises: detecting a driving voltage difference of the first and second driving voltages; if the driving voltage difference is smaller than a predetermined voltage difference, selecting the second driving voltage as the pre-Charge voltage; and if the driving voltage difference is larger than the predetermined voltage difference, selecting the first driving voltage as the pre-charge voltage.

18. The bit line pre-charge method of claim 15, wherein the selecting of the pre-charge voltage comprises: comparing the second driving voltage to a predetermined voltage; if the second driving voltage is greater than the predetermined voltage, selecting the second driving voltage as the pre-charge voltage; and if the second driving voltage is smaller than the predetermined voltage, selecting the first driving voltage as the pre-charge voltage.

19. A static random access memory (SRAM) device, comprising:

a bit line pair;

a memory cell connected to the bit line pair and electrically supplied with a first driving voltage;

a pre-charge voltage source electrically connected to one end of the bit line pair;

a sense amplifier connected to an opposite end of the bit line pair and supplied with a second driving voltage that is lower than the first driving voltage; and a control logic configured to monitor the first driving voltage and the second driving voltage and if the second driving voltage is lower than a predetermined voltage, control the pre-charge voltage source such that the bit line pair is pre-charged to a target voltage before the sense amplifier starts a sensing operation, wherein the first driving voltage is greater than the second driving voltage and the target voltage is between the first driving voltage and the second driving voltage.

20. The SRAM device of claim 19, wherein the pre-charge voltage source includes the second driving voltage and an output of a pull-up/pull-down circuit, wherein the control logic provides pull-up and pull-down control signals to the pull-up/pull-down circuit, wherein the second driving voltage is electrically coupled to the one end of the bit line pair and the pull-up/pull-down circuit.

* * * * *